(12) United States Patent
Chadalavada et al.

(10) Patent No.: US 10,746,798 B1
(45) Date of Patent: Aug. 18, 2020

(54) FIELD ADAPTABLE IN-SYSTEM TEST MECHANISMS

(71) Applicant: NVIDIA Corp., Santa Clara, CA (US)

(72) Inventors: Sailendra Chadalavada, Saratoga, CA (US); Shantanu K. Sarangi, Saratoga, CA (US); Milind Bhaiyyasaheb Sonawane, San Jose, CA (US); Sunil Bhavsar, Sunnyvale, CA (US); Jue Wu, Los Gatos, CA (US); Bonita Bhaskaran, San Jose, CA (US); Venkat Abilash Reddy Nerallapally, San Jose, CA (US); Badrinath Srirangam, Fremont, CA (US)

(73) Assignee: NVIDIA Corp., Santa Clara, CA (US)

( * ) Notice: Subject to any disclaimer, the term of this patent is extended or adjusted under 35 U.S.C. 154(b) by 0 days.

(21) Appl. No.: 16/428,790

(22) Filed: May 31, 2019

(51) Int. Cl.
*G01R 31/3185* (2006.01)
*G01R 31/3177* (2006.01)
*G01R 31/28* (2006.01)
*G01R 31/317* (2006.01)

(52) U.S. Cl.
CPC . *G01R 31/318597* (2013.01); *G01R 31/2832* (2013.01); *G01R 31/3177* (2013.01); *G01R 31/31707* (2013.01); *G01R 31/318533* (2013.01); *G01R 31/318536* (2013.01); *G01R 31/31725* (2013.01)

(58) Field of Classification Search
CPC ..... G06F 11/26; G06F 11/27; G01R 31/3187; G01R 31/318597; G01R 31/318533; G01R 31/318536; G01R 31/31707; G01R 31/2832
See application file for complete search history.

(56) References Cited

U.S. PATENT DOCUMENTS

| | | |
|---|---|---|
| 5,355,369 A | 10/1994 | Greenberger et al. |
| 5,598,421 A | 1/1997 | Tran et al. |
| 5,781,560 A | 7/1998 | Kawano et al. |
| 5,805,609 A | 9/1998 | Mote, Jr. |
| 6,425,100 B1 * | 7/2002 | Bhattacharya ... G01R 31/31853 712/38 |
| 7,269,772 B1 * | 9/2007 | Li ..................... G01R 31/31725 714/731 |
| 7,818,640 B1 | 10/2010 | Lerner |
| 7,913,132 B2 * | 3/2011 | Gemmeke ........ G01R 31/31853 714/726 |
| 2002/0069386 A1 | 6/2002 | Neeb |
| 2004/0222305 A1 | 11/2004 | Leaming |
| 2010/0023820 A1 | 1/2010 | Douskey et al. |
| 2010/0153797 A1 | 6/2010 | Youm et al. |
| 2012/0216089 A1 * | 8/2012 | Chen ................. G01R 31/3008 714/727 |
| 2012/0272111 A1 | 10/2012 | Xu |

* cited by examiner

*Primary Examiner* — Shelly A Chase
(74) *Attorney, Agent, or Firm* — Rowan TELS LLC

(57) ABSTRACT

A system for testing complex integrated circuits in the field using updated tests, test sequences, models, and test conditions such as voltage and clock frequencies, over the life cycle of the circuit.

18 Claims, 28 Drawing Sheets

FIELD ADAPTABLE IN-SYSTEM TEST MECHANISMS

BACKGROUND

The design complexity and high-performance computing requirements of modern integrated circuit devices such as system-on-a-chip (SOC) devices and graphics processing unit (GPU) devices continues to increase.

Functional safety standard ISO26262 ASIL (Automotive Safety Integrity Level) specifies functional safety standards for electronic components used in autonomous automotive applications. In-system tests may be carried out using logic built-in self-tests (LBIST) and memory built-in self-tests (MBIST). MBIST may be used for example to test on-chip memory arrays of SOCs, GPUs, and other integrated circuit devices. Traditional in-field application tests utilize functional patterns that have long development cycles and that are difficult to quantify. Traditional in-field application test patterns may require many development iterations. Generation of such test patterns is expensive and tends to incur high execution latency.

Depending on a number of factors the device utilized in a particular implementation may be configured into many different functional versions, herein called SKUs, where each SKU is a particular configuration of a more generic functional design. Factors affecting a SKU configuration include the target implementation power and functional requirements, customer preferences, and level of functional autonomy desired for the part in the implementation (e.g., in an autonomous automotive application).

In order to have the widest applicability, a SOC, GPU, or other device may be designed generally to be configurable to support many different SKUs. Not all circuits or features of the device may be operational in a particular SKU. A device configured into a particular SKU may thus include both functional regions and non-functional regions. The non-functional regions may be turned off in the field, for example to save power, enabling the use of a single generic functional design configurable for different power budgets and costs.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1:
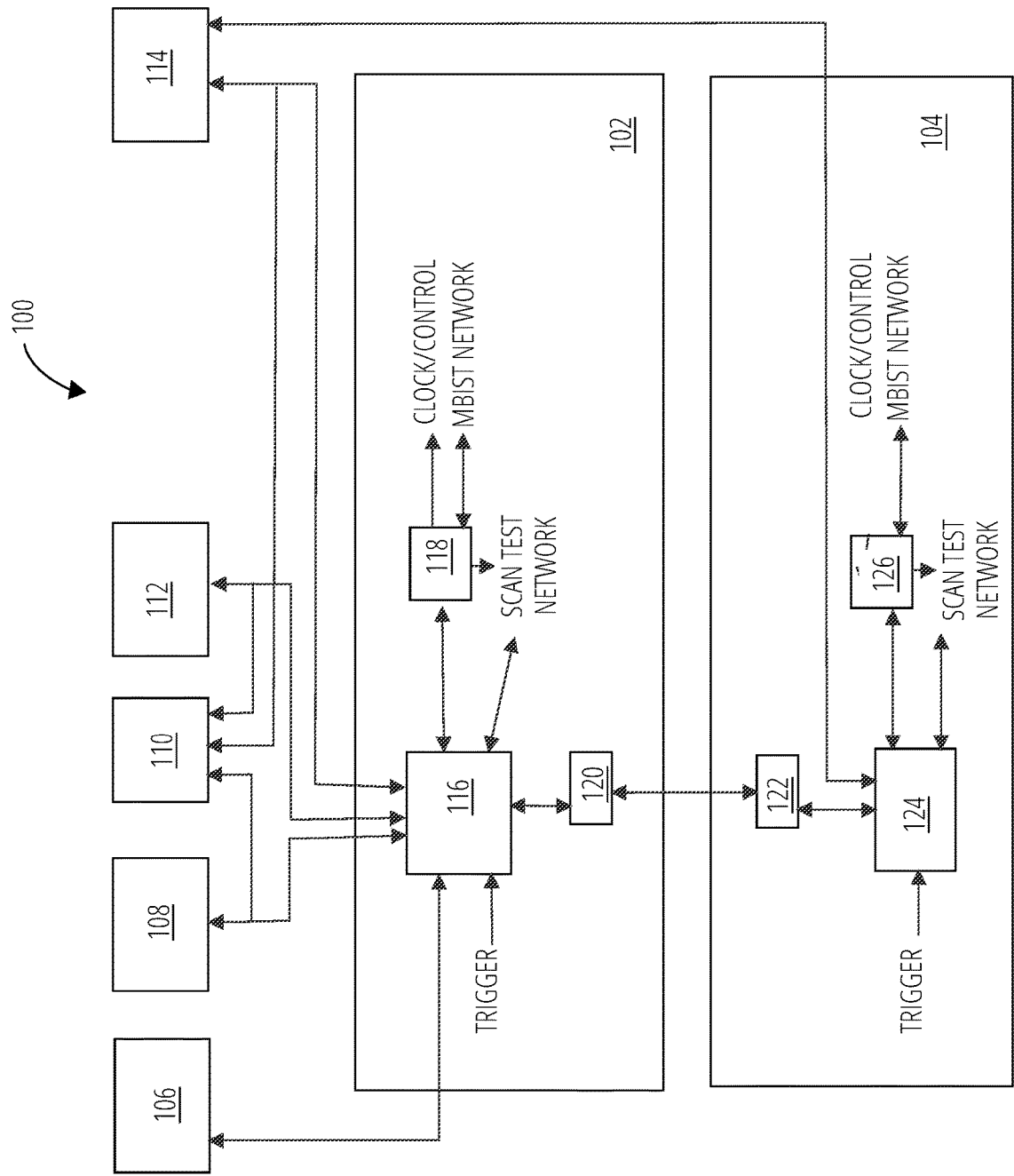
FIG. 1 illustrates an in-system test system 100 in accordance with one embodiment.

For safety-critical applications in autonomous automotive applications, in-system test is typically performed during each key-on event and/or key-off event of the autonomous automobile. The in-system test may also be executed while the autonomous automobile is in operation (on-line testing). The in-system test application may collect and analyze test results over time.

Traditional techniques for in-system test support only a fixed set of test patterns, models, and algorithms, which are difficult to modify in the field.

Deterministic ATPG test patterns may achieve higher test coverage and quality but at the cost of more complicated and expensive automatic test equipment (ATE). The use of deterministic ATPG test patterns is often unsuitable for in-system test applications. Patterns that are x-tolerant LBIST (xLBIST) may also be used.

The disclosed systems and methods enable testing of complex systems utilizing SOC and/or GPU components. The disclosed systems and methods may be applied for off-line testing as well as on-line testing and enable the updating of tests, test sequences, models, and test conditions such as voltage and clock frequencies, over the life cycle of a safety critical application.

Hardware controllers execute ATPG/xLBIST tests based on test data packets fetched from an external storage device such as a solid state drive, an EMMC (embedded multimedia card), etc. and store results of the test back to the external storage device. The systems and methods may utilize on-chip execution of high quality and x-tolerant in-system tests for autonomous automotive applications.

A test scheduling scheme may be defined based on one or more of (1) key-on events and key-off events, (2) a number of components/logic blocks to test on the SOC and/or GPU, (3) types of test patterns to be executed (ATPG and/or xLBIST), and (4) latency requirements. A test may be scheduled online for connected devices. Upon completion of an in-system test, the hardware controllers may shut down the device under test. After completion of the in-system test by the hardware controllers the results may be stored. On next power-on the system analytical application may read the in-system test results from the storage to determine which tests passed or failed during previous power-off or power-on events. If on-chip execution of the tests failed, the hardware controllers may generate sufficient details to determine the cause of the failure inside the logic blocks.

On-chip execution may be utilized without the use of automatic test equipment for autonomous automotive applications with deterministic ATPG test patterns as well as non-deterministic LBIST test patterns and xLBIST tests with high diagnosis precision. The disclosed systems and methods are scalable and adapt to testing requirements over the life-cycle of the product. The disclosed systems and methods are further applicable to system-level test (SLT).

Disclosed herein is a hardware controller specifically designed to execute deterministic ATPG, xLBIST, and non-deterministic LBIST patterns via on-chip execution, with high coverage. The targeted testing conditions and test application sequence may be updated over the product life cycle. Some examples of models that are supported by the scheme are Stuck At, Transition, Cell Aware, Small Delay, and Bridging. Depending on the platform requirements tests may be added to target different models. The hardware controller may be programmed via IEEE 1500 interfaces and techniques with overrides provided via software registers.

The disclosed system may be applied for testing per ISO26262 ASIL requirements. The system is suitable for on-line testing and off-line testing, and is adaptable to different clock frequencies and data rates. The performance is comparable to that achieved using automatic test equipment.

Further disclosed herein is a design functional test architecture for field-run in-system tests that focus only on the functional regions of a device, ignoring responses from non-functional regions. Such tests have traditionally been run on automatic test equipment where the power budget is not a constraint. Using automatic test equipment all the regions of the device are tested and hence all regions are woken up and tested. This is impractical for in-system test. Traditional design functional test architectures are geared for automatic test equipment and unwieldy for in-system test.

The use of power clamps on regions of a device poses a significant challenge to the logistics of performing an in-system test. An in-system test process generated for all regions of a device that utilizes power gates cannot typically be reused across different SKUs. Generating a separate in-system test for every SOC device design is not practical due to the number of permutations and combinations of possible power gate states involved.

Disclosed herein are a generic design functional test architecture and test image for use across many device SKUs in the field. The design functional test architecture enables an in-system test to be executed on the functional regions of the device without being impacted by power gated regions. Enhanced system software ensures that only responses from the functional regions of the device are analyzed, while ignoring responses from the non-functional regions of the device.

FIG. 1 illustrates an in-system test system 100 in one embodiment. The in-system test system 100 comprises a SOC 102 comprising a hardware controller 116 and an IEEE 1500 logic block 118, that interacts with a GPU 104 comprising a hardware controller 124 and an IEEE 1500 logic block 126. The SOC 102 and the GPU 104 interact with one another using PCIe (for example) via inter-chip controllers (controller 120 and controller 122). Other components external to the SOC 102 and GPU 104 include a mass storage device 106 to store the test patterns and test results, a power manager 108, a memory control unit (MCU 110), and thermal sensors (thermal sensor 112 and thermal sensor 114).

The in-system test system 100 may execute logic block and memory tests in the field on one or both of the SOC 102 and GPU 104. The test patterns and results are stored in a mass storage device 106 flash (or other type) memory. The hardware controller 116 of the SOC 102 and the hardware controller 124 of the GPU 104 communicate with various on-chip and off-chip components to execute the tests utilizing the IEEE 1500 logic blocks (IEEE 1500 logic block 118 and IEEE 1500 logic block 126) of the SOC 102 and the GPU 104. The in-system test system 100 may be utilized to execute ATPG and xLBIST test packets on an autonomous automotive application.

The in-system test system 100 may process requests to execute an in-system test either during key-on events or key-off events. The operating software of the platform (e.g., autonomous automotive application) configures the in-system test system 100 to operate in the required testing condition for power, clock sources, clock frequencies, temperature, and voltage, for example. The conditions may be adjusted based on coverage requirements. The in-system test system 100 also communicates to a platform safety processor to enable watch dog timers and disable certain monitoring functions for the duration of the tests.

Depending on platform configuration the in-system test is configured to test one or both of the SOC 102 and GPU 104. The in-system test system 100 establishes the communication link between the SOC 102 and the GPU 104 to enable these components to fetch the test pattern stored on the mass storage device 106.

In one embodiment the hardware controller 116 is a primary controller responsible for fetching test patterns for both the SOC 102 and the GPU 104 and transfers the test patterns for the GPU 104 to the hardware controller 124 of the GPU 104.

The in-system test system 100 tests various functional units (also referred to herein as logic blocks). The thermal sensor 112 and thermal sensor 114 may provide operational temperature information for the platform that influences the test patterns applied or interpretation of the test results or both.

In one embodiment the in-system test system 100 is applied to an autonomous automotive application and implements a test scheduling scheme based on key-on events and key-off events, a number of logic blocks to be tested on the SOC 102 and the GPU 104, types of test patterns to be executed (ATPG and/or xLBIST), and latency requirements. On a subsequent power-on of the autonomous automotive application the system software reads the test results from the mass storage device 106 to determine which tests passed or failed during a previous power-off event or power-on event. If on-chip execution of planned tests fail, then the hardware controller 116 and hardware controller 124 store sufficient details to the mass storage device 106 to determine the cause of the failure inside the tested logic blocks using debug/diagnosis software.

The hardware controller 116 and hardware controller 124 are designed for on-chip execution of high quality deterministic ATPG and non-deterministic xLBIST patterns. The targeted faults, tests, testing conditions, and test application sequence may be updated over the product life cycle.

Figure 2:
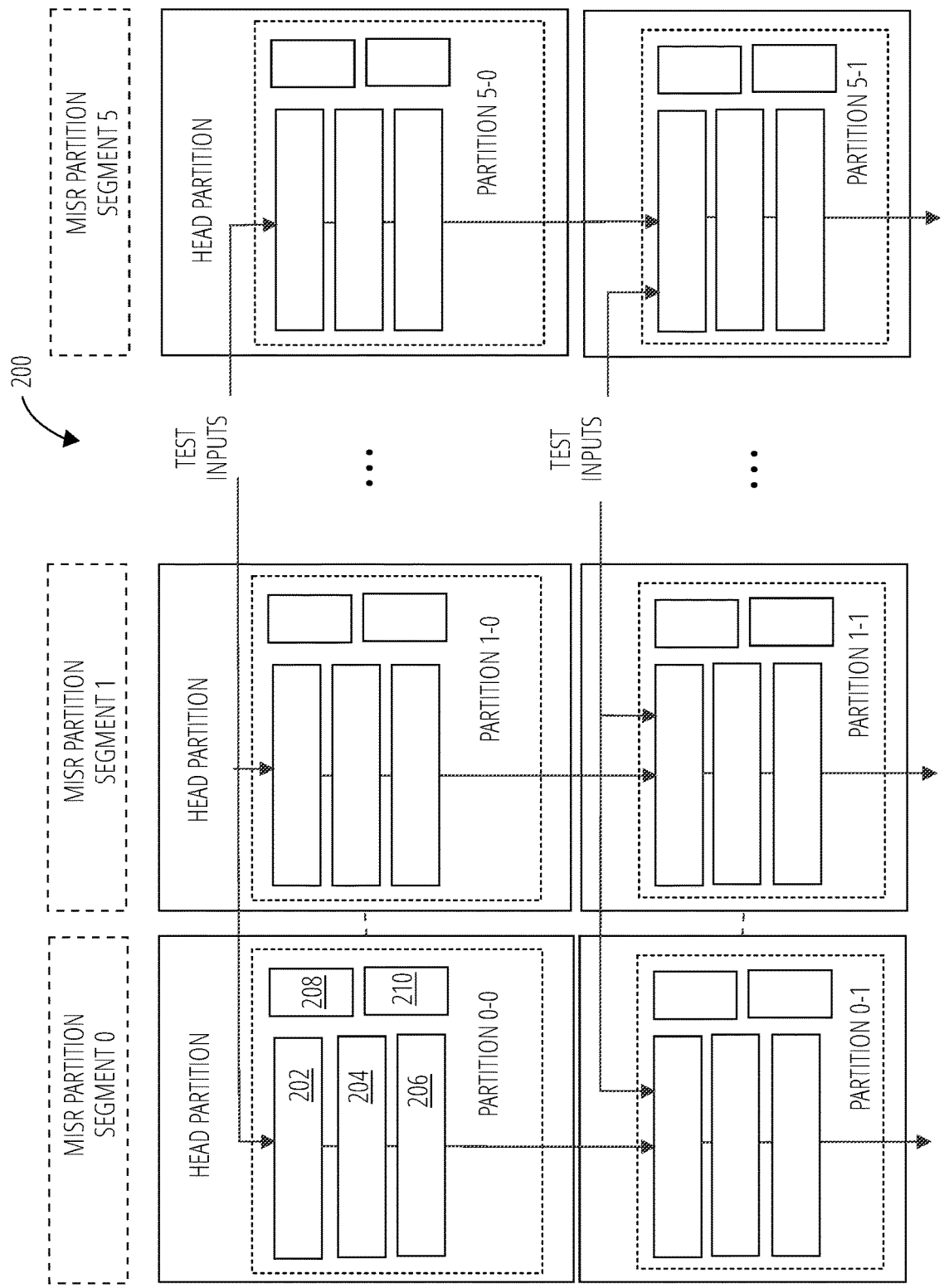
FIG. 2 illustrates a logic block-level sequential scan compression architecture 200 in accordance with one embodiment.
Figure 3:
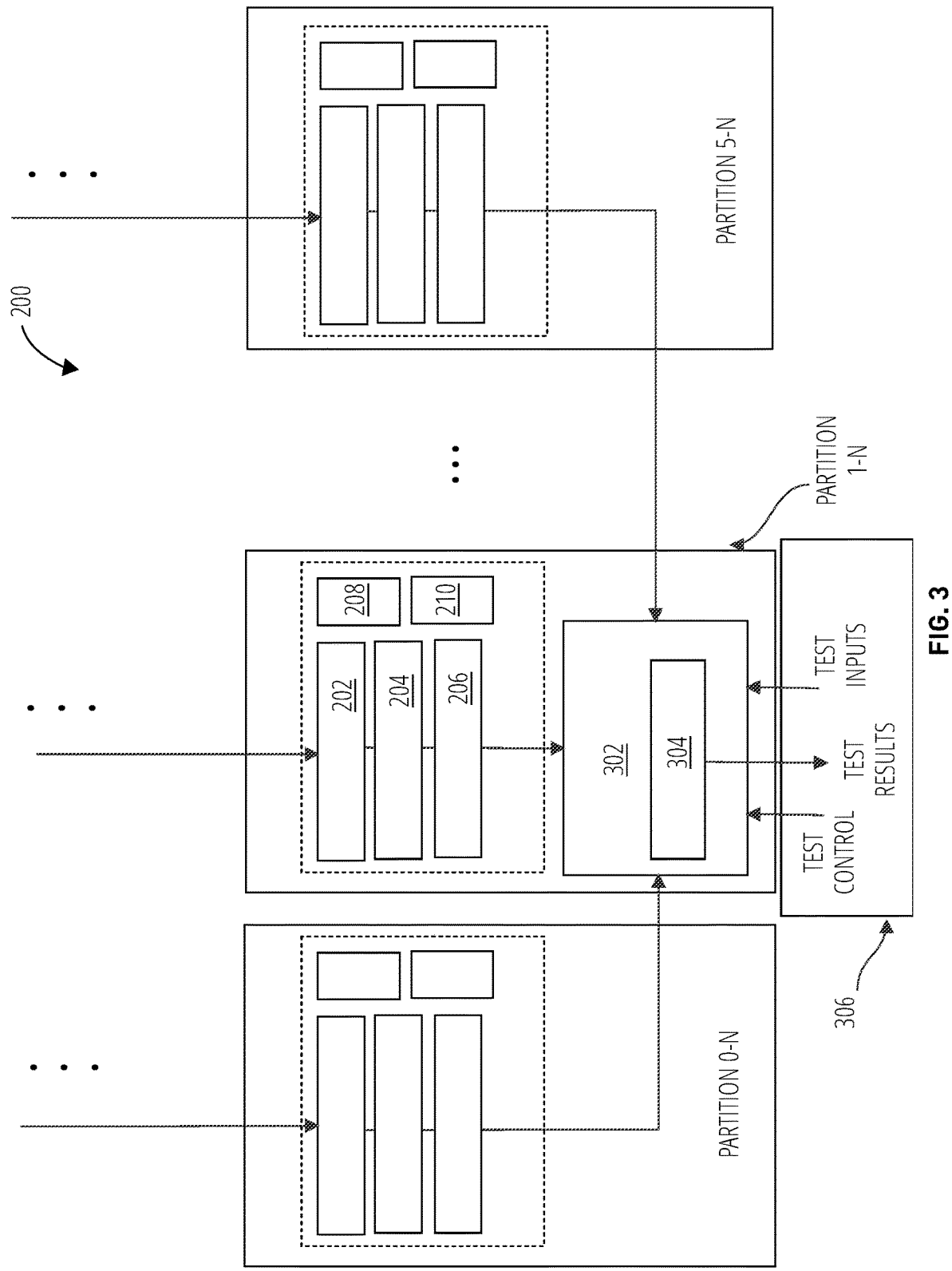
FIG. 3 further illustrates the logic block-level sequential scan compression architecture 200 in accordance with one embodiment.

FIG. 2 and FIG. 3 illustrate an embodiment of a logic block-level sequential scan compression architecture 200. Each MISR-supplied partition of the logic block-level sequential scan compression architecture 200 comprises a deserializer 202, a sequential decompressor 204, a sequential compressor 206, an IEEE 1500 logic block 208, and a TAM multiplexer 210 to coordinate the components. At least one of the partitions interfaces with the scan links 306 and additionally comprises a top controller 302 and a flexible serializer 304.

At a high level, during a logic block test the functional registers (or other storage cells) of the SOC 102 or GPU 104 are coupled into a scan chain. One or more test pattern is loaded on the scan chain via design for test (DFT) controllers, clock pulses are applied in functional mode to capture the responses of the logic blocks to the test patterns, and the results are stored to the mass storage device 106. Test patterns are loaded to the DFT controllers in the various partitions of the SOC 102 or GPU 104 and results are captured in a multiple-input signature register (MISR) in every partition. MISRs of a group of partitions (called segments) are daisy chained and each segment can be unloaded via a dedicated scan out pin or bus.

Figure 4:
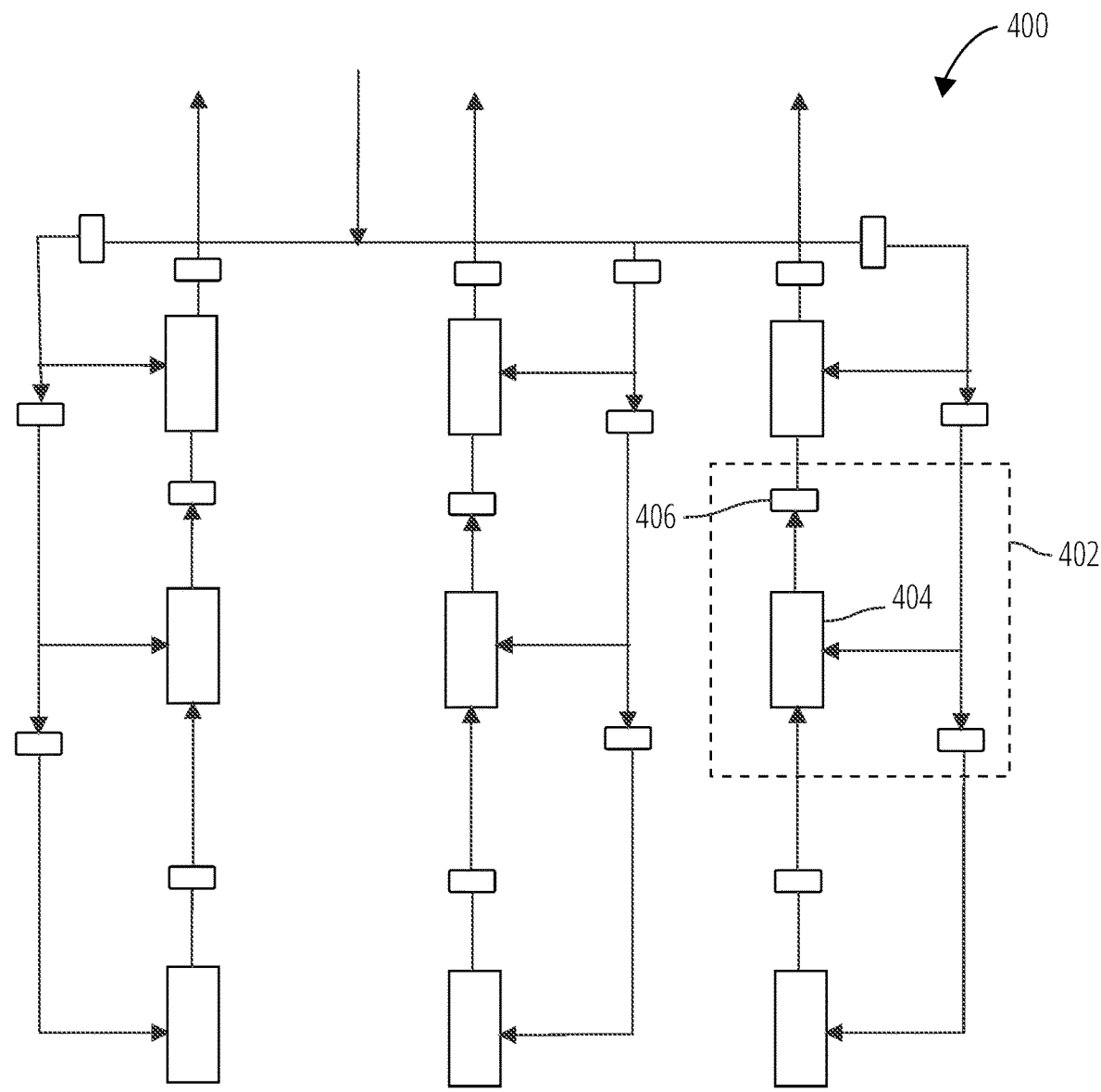
FIG. 4 illustrates a design functional test architecture 400 in accordance with one embodiment.

FIG. 4 illustrates a design functional test architecture 400 in one embodiment. The design functional test architecture 400 comprises multiple test partitions (e.g., test partition 402), each test partition comprising test logic 404 and one or more status register 406.

Figure 5:
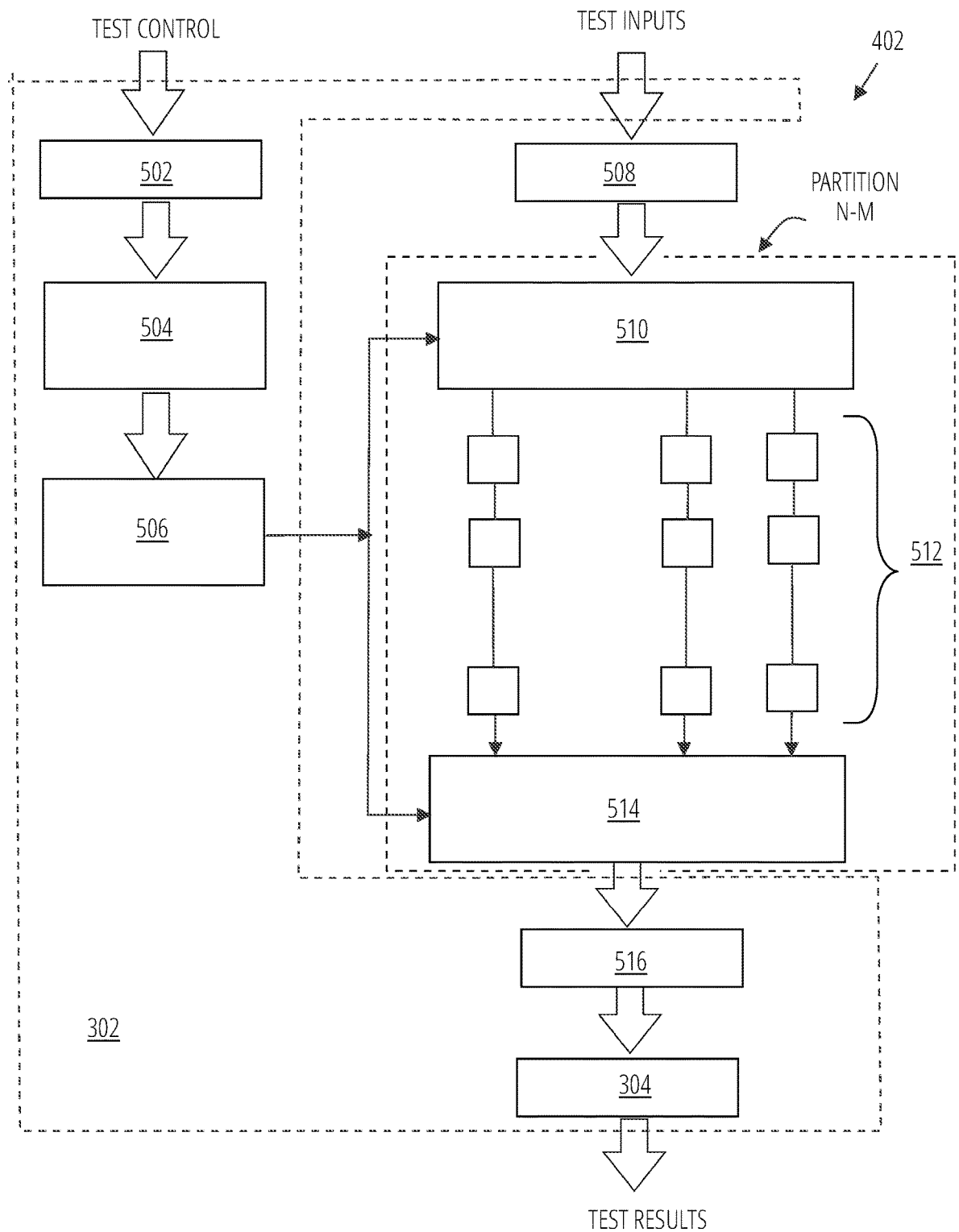
FIG. 5 illustrates a test partition 402 of an integrated circuit in accordance with one embodiment.

FIG. 5 illustrates one embodiment of a test partition 402 in more detail. The test partition 402 comprises a deserializer 502, a high-performance interface 504, a logic block controller 506 for the test control signals, and a flexible deserializer 508 and a sequential decompressor 510 for the test patterns. The logic block controller 506 controls the sequential decompressor 510 and a sequential compressor 514 to carry out the tests on the functional logic blocks and scan chains 512 and to compress the results in a MISR 516. A flexible serializer 304 scans the test results out of the MISR 516 to the mass storage device 106 for storage.

Within each partition, the logic block-level sequential scan compression architecture 200 is utilized. Test patterns are deserialized, decompressed, and applied to the functional logic blocks and scan chains 512, and responses are compressed by the sequential compressor 514 into the MISR 516. Test data responses are captured in the MISR 516 and compared with the signature (desired test results) loaded, for example, in a reference MISR. A result of the comparison may be stored in a 1-bit status register (e.g., another MISR) or other memory. All the MISR 516, reference MISR, and status registers in a segment may be daisy chained.

Figure 6:
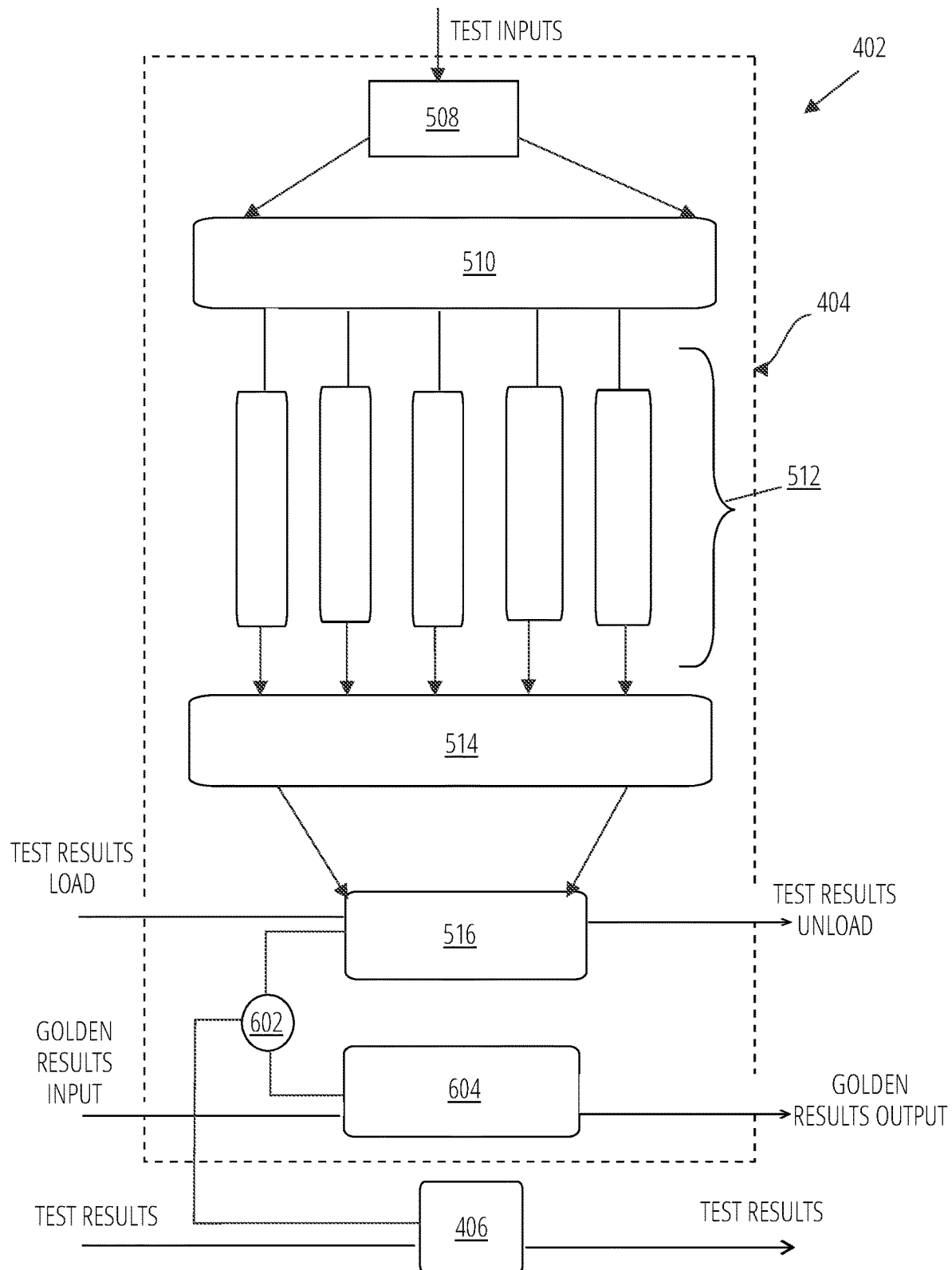
FIG. 6 illustrates additional aspects of the test partition 402 in accordance with one embodiment.

FIG. 6 illustrates additional aspects of a test partition 402 in one embodiment. During an in-system test the functional blocks of the chip are coupled to form scan chains, test data is loaded on to each test partition 402, clock pulses are applied in functional mode to generate test results in the MISR 516 of each partition, the results are input to a comparator 602 along with expected results loaded in a golden shadow MISR 604, and the results of the comparison are stored in the partition status register 406 for unloading to the mass storage device 106.

Figure 7:
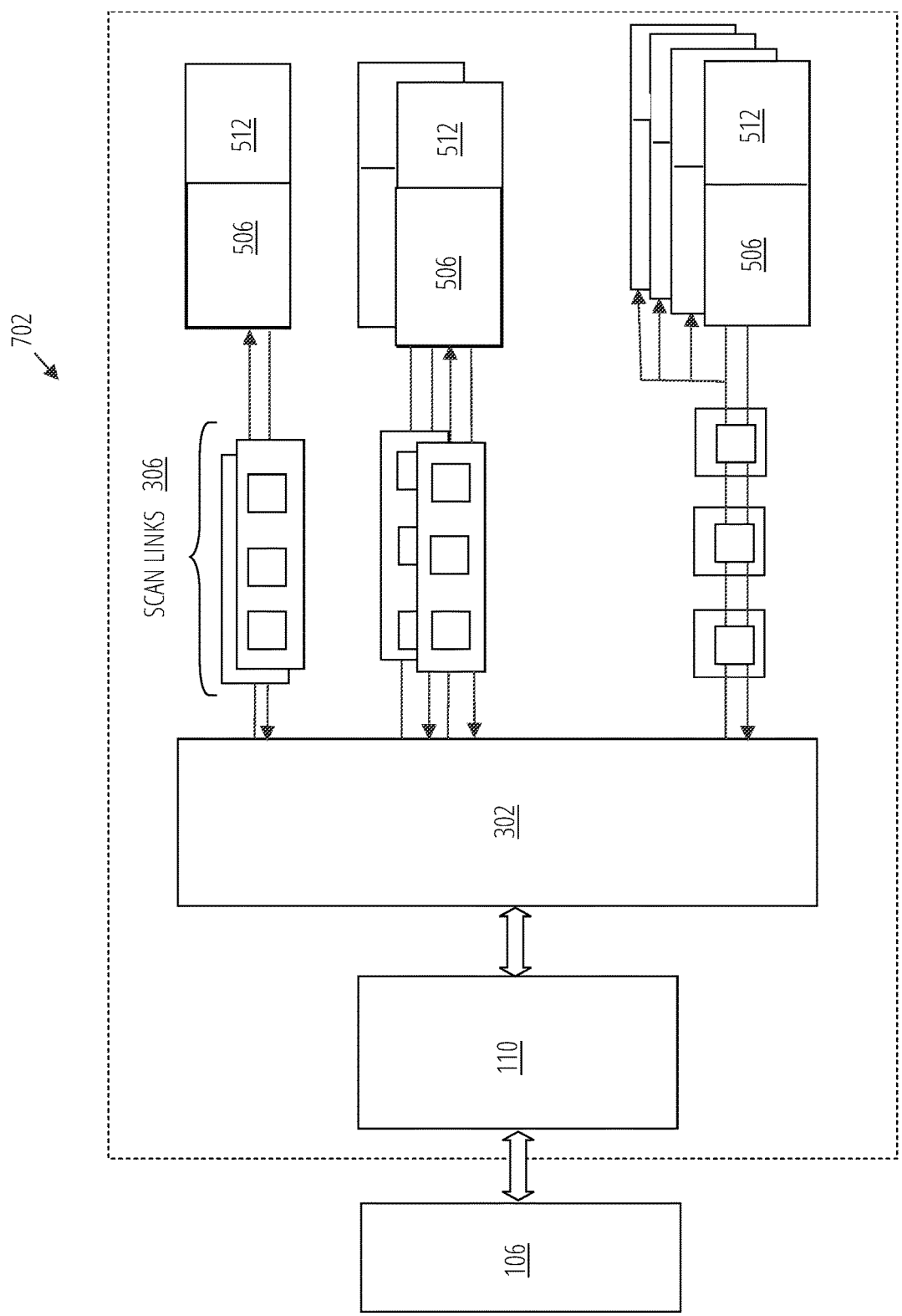
FIG. 7 illustrates a design functional test architecture 702 in accordance with one embodiment.

FIG. 7 illustrates a design functional test architecture 702 in one embodiment. The design functional test architecture 702 comprises a mass storage device 106, an MCU 110, scan links 306, and a top controller 302. Each partition of the device to test comprises a logic block controller 506 and functional logic blocks and scan chains 512.

The design functional test architecture 702 executes in-system test applications for ATPG test patterns and xLBIST test patterns for multiple functional logic blocks and scan chains 512 on a chip during field operation. The design functional test architecture 702 utilizes a sequential scan compression architecture used, for example, in newer generation of NVIDIA GPUs and mobile SOCs. The test patterns are stored on the mass storage device 106, which also stores the test results. Input and output to the mass storage device 106 is managed by the MCU 110. Test patterns are read from the mass storage device 106 and executed during one or both of key-off events and key-on events of an autonomous automotive application.

The test patterns are accessed for on-chip execution during in-system testing by intercepting the multiplexers inside the partitions being tested. The components used for this purpose are the top controller 302, the scan links 306, and the logic block controller 506 of each of the functional logic blocks and scan chains 512. The top controller 302 reads test patterns from the mass storage device 106, and writes the test results back to the mass storage device 106 after execution of the tests. The test patterns are encoded in packet format, and after being transported to each logic block controller 506 are decoded and applied to the functional logic blocks and scan chains 512. The test results are also encoded in packet format, and forwarded to the top controller 302 to be written to the mass storage device 106.

Figure 8:
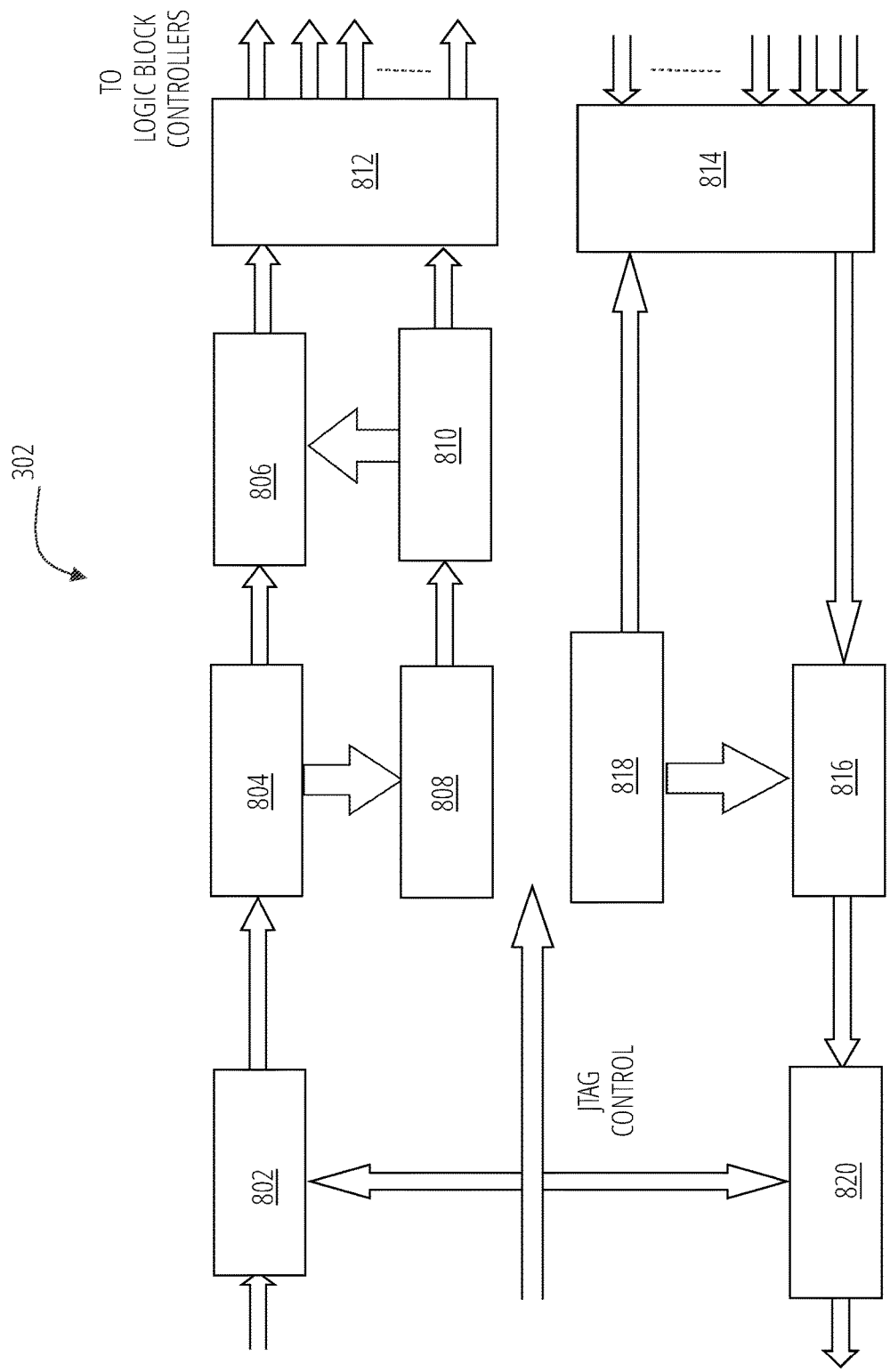
FIG. 8 illustrates a top controller 302 in accordance with one embodiment.

FIG. 8 illustrates a top controller 302 in one embodiment. The top controller 302 may be a component of the hardware controller 116 or hardware controller 124 for the SOC 102 and GPU 104, respectively. The top controller 302 interfaces between the hardware controller 116 and/or hardware controller 124 of the SOC 102 and GPU 104, respectively (primary in-system test units), and the logic block controller 506 for each of the functional logic blocks and scan chains 512. The scan links 306 receives test patterns from the hardware controller 116 and/or hardware controller 124 and forwards the test data to each logic block controller 506. Test scheduling is also performed by the scan links 306, as is management of the test data for each logic block controller 506 to reduce testing latency. After execution of test patterns, the results are queried from each logic block controller 506 and returned to the hardware controller 116/hardware controller 124 to be written to the mass storage device 106.

The test data input path of the top controller 302 in the illustrated embodiment comprises a packet data write controller 802 that receives incoming test data and provides it to a packet write buffer 804. A packet data forwarding unit 806, a packet data read and decode unit 808, and a packet data link controller 810 cooperate to determine when to apply test data packets in the packet write buffer 804 to the packet data link multiplexer 812, from which the test packets are routed to a particular logic block controller 506. On the return data path, a status data link demultiplexer 814 receives test results from each logic block controller 506 and stores the test results into a status write buffer 816. A status read arbitration and write controller 818 controls the outflow of test result packets to the status data read controller 820, from which the test result packets are returned to the hardware controller 116 and/or hardware controller 124 for storage into the mass storage device 106.

The scan links 306 transport test data packets or test result packets between the top controller 302 and each logic block controller 506. The scan links 306 manage the transportation of test data and results under latency constraints of the platform configuration. The scan links 306 also function to reduce the routing density between narrow channels, to provide a variable width of test data and status transfer. When the platform configuration utilizes a repetitive design scheme, the test data for many of the functional logic blocks and scan chains 512 may be identical and the scan links 306 may store a single copy and apply it to multiple groups of replicated functional logic blocks and scan chains 512. The transfer management of test data to a set of replicated design units may be implemented using broadcast (fork) scan links 306.

Figure 9:
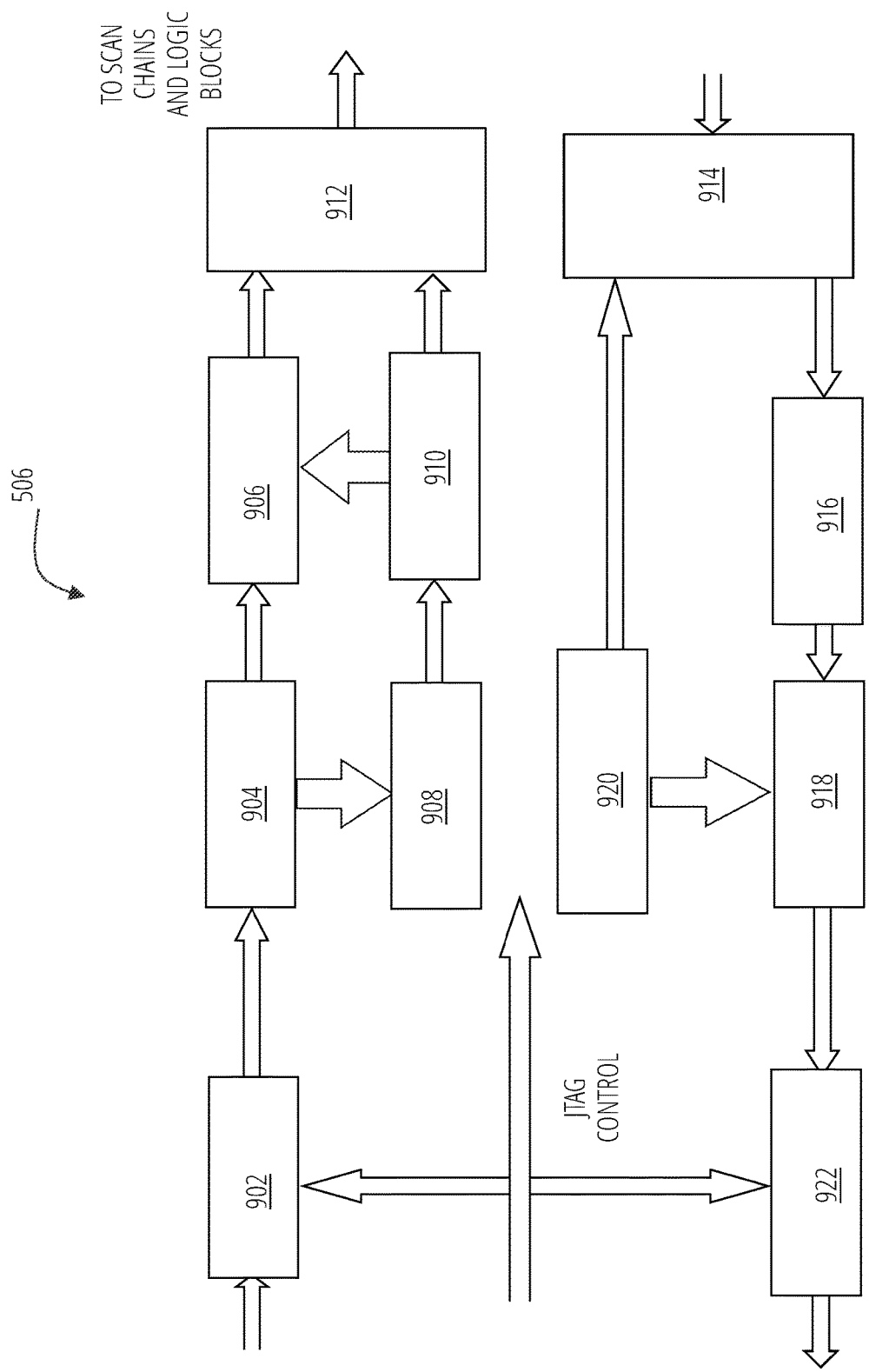
FIG. 9 illustrates a logic block controller 506 in accordance with one embodiment.

FIG. 9 illustrates a logic block controller 506 in one embodiment. The logic block controller 506 receives test data packets from the top controller 302, serializes the data packets, and outputs test signals to the functional logic blocks and scan chains 512 for the logic block controller 506.

The logic block controller 506 is designed similarly to the top controller 302 except that instead of routing the testing data to each logic block controller 506, it serializes the test packets to the functional logic blocks and scan chains 512 and consolidates test results for return to the top controller 302.

The logic block controller 506 comprises a packet data write controller 902, a packet write buffer 904, a packet data serializer 906, a packet data read and decode unit 908, a packet data serialization controller 910, a packet data control sequencer 912, for applying the test packets to the functional logic blocks and scan chains 512.

The logic block controller 506 further comprises a status data receiver 914, a status data consolidation buffer 916, a status write buffer 918, a status read arbitration and write controller 920, and a status data read controller 922, for consolidating test results from the functional logic blocks and scan chains 512 and forming them into packets for the top controller 302.

Figure 10:
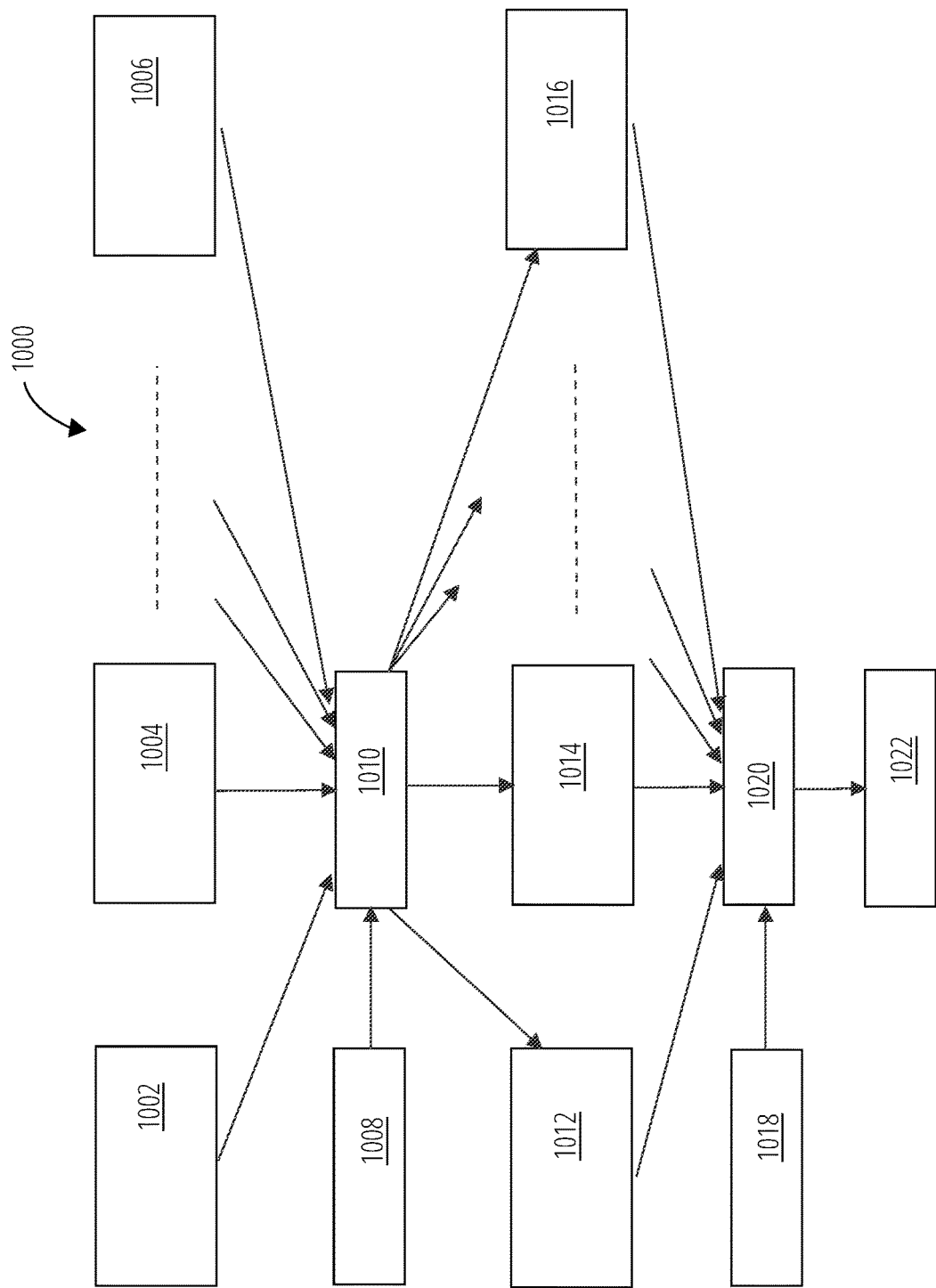
FIG. 10 illustrates a packet encoding 1000 in accordance with one embodiment.

FIG. 10 (packet encoding 1000) illustrates a Standard Test Interface Language (STIL) to in-system test packet encoding in one embodiment. An ATPG and xLBIST test pattern for logic block #1 1002, an ATPG and xLBIST test pattern for logic block #2 1004, and so on up to an ATPG and xLBIST test pattern for logic block #n 1006, are input along with a test-specific configuration 1008 to a STIL-to-packet encoder 1010. The resulting test data/result packet for logic block #1 1012, test data/result packet for logic block #2 1014, and so on up to the test data/result packet for logic block #n 1016, are input along with a platform configuration and test specific sequence data 1018 to generate test data and test result images 1020, which are stored to an external storage device 1022.

To achieve high test quality without exceeding the platform configuration storage and latency requirements it is sometimes necessary to utilize both deterministic ATPG and x-tolerant LBIST test patterns (where 'x' indicates an unknown condition). The deterministic ATPG patterns yield higher test coverage but the amount of test data is relatively large compared to LBIST. X-tolerant LBIST yields reasonably good test coverage with a relatively small amount of test data. The system supports use of both types of test patterns with a single test controller design integrated with a sequential scan compression architecture.

Figure 11:
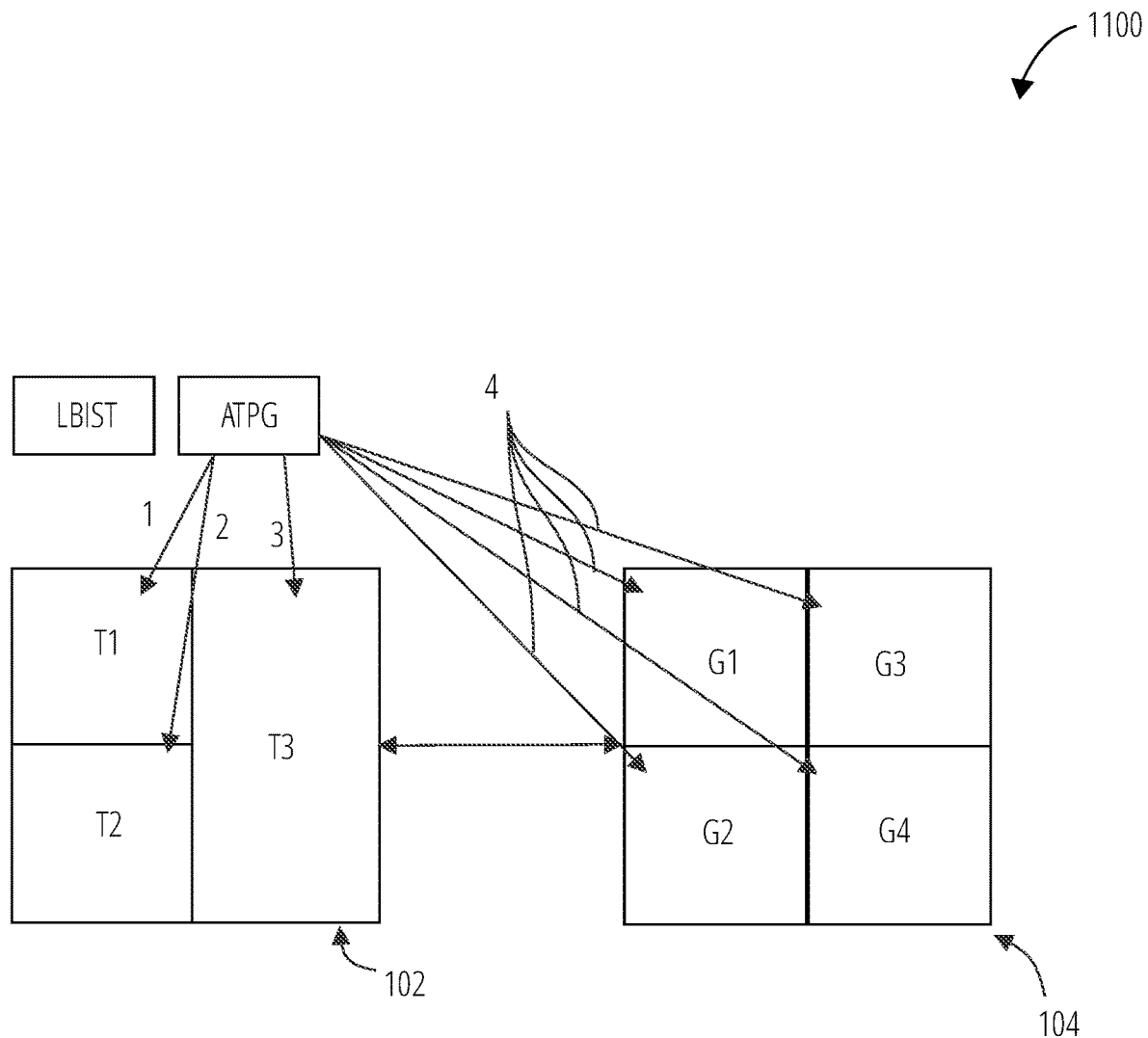
FIG. 11 illustrates a serial and concurrent ATPG in-system test 1100 in accordance with one embodiment.

As shown in the example of FIG. 11, the system supports both serial and concurrent ATPG in-system test 1100. For example, it is possible to serially test multiple unique design units within a SOC using deterministic ATPG. The top controller 302 fetches ATPG test patterns from the mass storage device 106 and performs on-chip execution. Due to the large volume of test data involved in such testing, the top controller 302 and scan links 306 drive data serially to each unique logic block or to multiple logic blocks in a replicated group. This integrates both a serial test for the unique logic blocks and a concurrent test for the replicated logic blocks, reducing latency.

Figure 12:
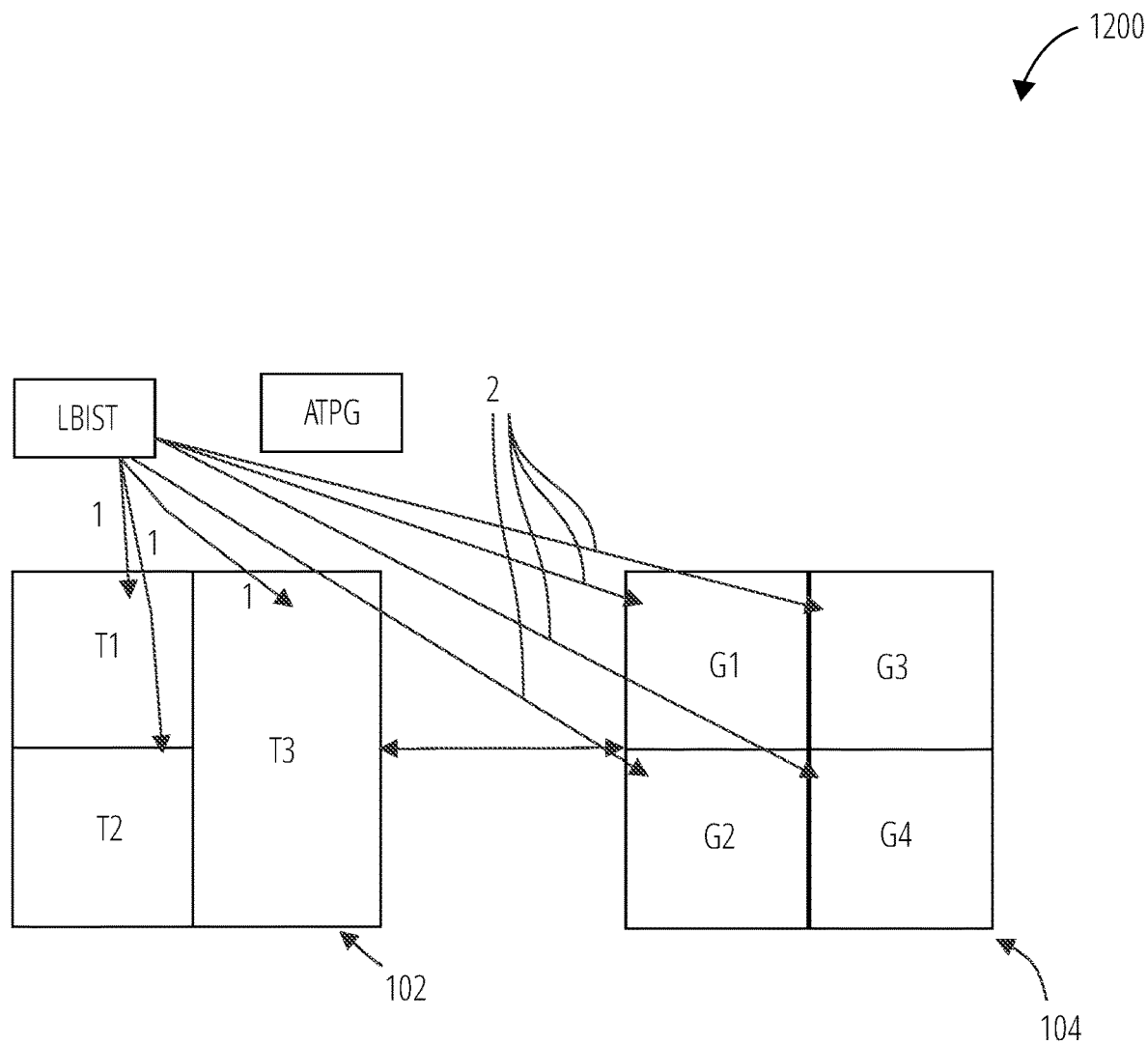
FIG. 12 illustrates a pseudo-concurrent testing with LBIST 1200 in accordance with one embodiment.

FIG. 12 illustrates pseudo-concurrent testing with LBIST 1200 in one embodiment. Different design units in the SOC 102 and the GPU 104 are concurrently tested using xLBIST. Both unique and replicated logic blocks can be tested using xLBIST. The top controller 302 and scan links 306 are engaged during the initial loading of test patterns, and then used to load test data for multiple logic blocks in a staggered fashion. Once the test data is fully transferred to the functional logic blocks and scan chains 512 each individual logic block controller 506 executes the xLBIST patterns concurrently.

Figure 13:
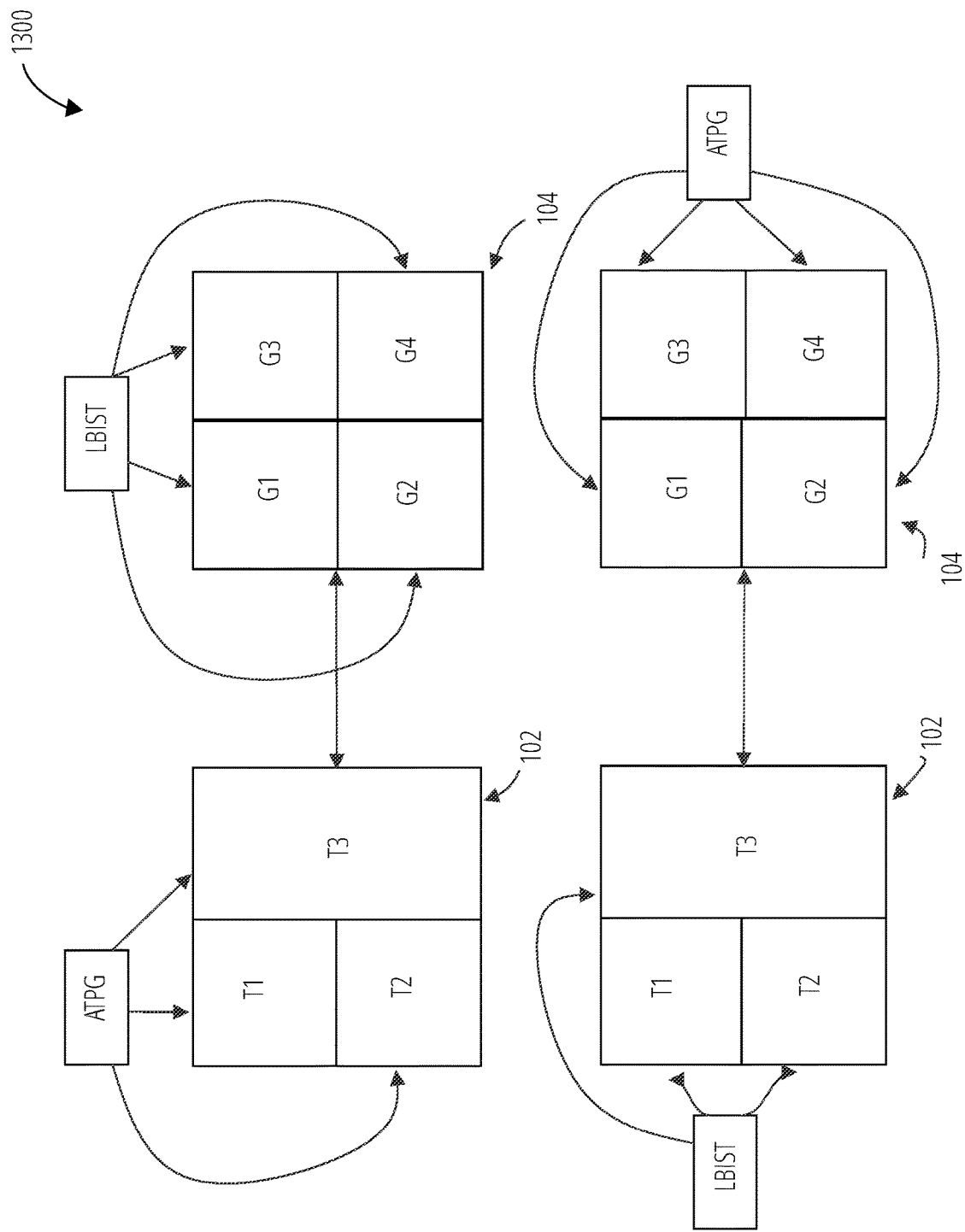
FIG. 13 illustrates a pseudo-concurrent testing with ATPG and xLBIST 1300 in accordance with one embodiment.

FIG. 13 illustrates pseudo-concurrent testing with ATPG and xLBIST 1300 in one embodiment. Differently designed SOCs and GPUs are tested, where one design of each is tested using deterministic ATPG and other design is tested using xLBIST.

Figure 14:
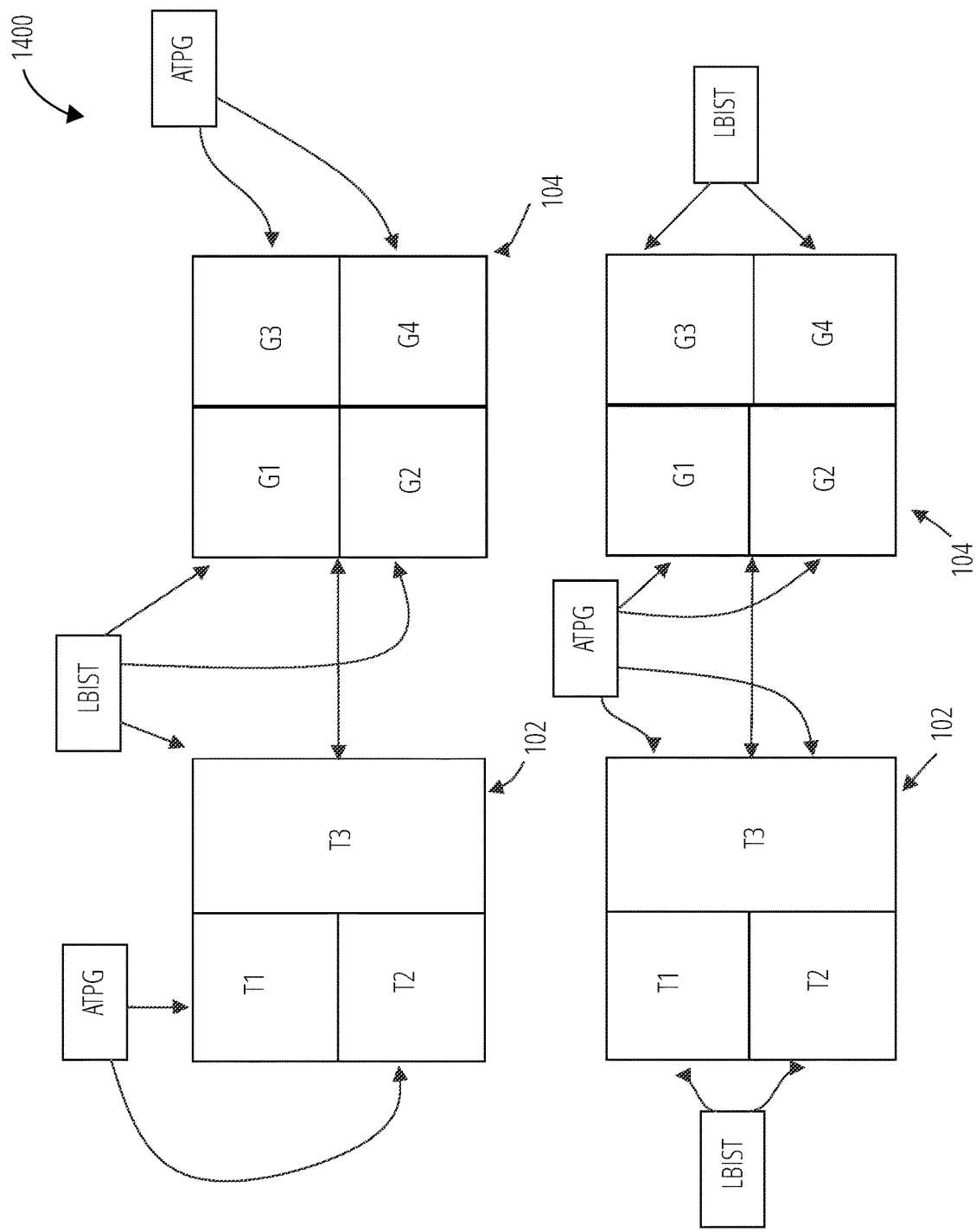
FIG. 14 illustrates a pseudo-concurrent testing using xLBIST and ATPG 1400 in accordance with one embodiment.

FIG. 14 illustrates pseudo-concurrent testing using xLBIST and ATPG 1400 in one embodiment. The xLBIST test execution is initiated on particular design (unique and/or replicated), and then ATPG tests are initiated on the other design units.

Figure 15:
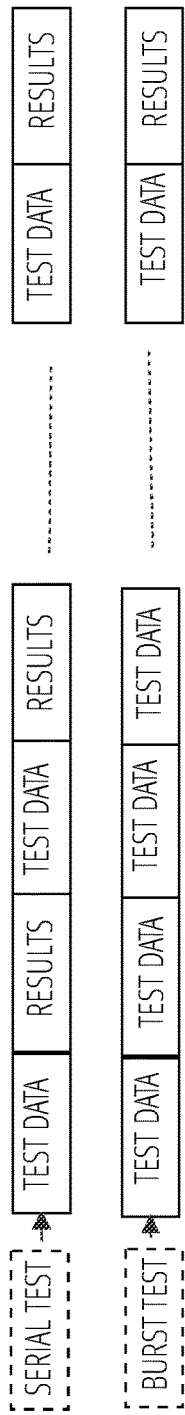
FIG. 15 illustrates data flows 1500 in accordance with one embodiment.

FIG. 15 illustrates data flows 1500 for burst and serial testing in one embodiment. When utilizing a sequential scan compression architecture, there are several ways to execute the tests, and unload the test results. Some situations require the testing to be carried out in a short amount of time, and so multiple tests may be executed and then results unloaded in a batch to determine pass or fail (see 'burst test' in FIG. 15). In other situations the pass/fail status for particular logic blocks, sub-tests, components, partitions etc. needs to be evaluated as results come back. In these situations the tests may be applied in serial fashion, and results are unloaded after every sub-test execution (see 'serial test' in FIG. 15).

Figure 16:
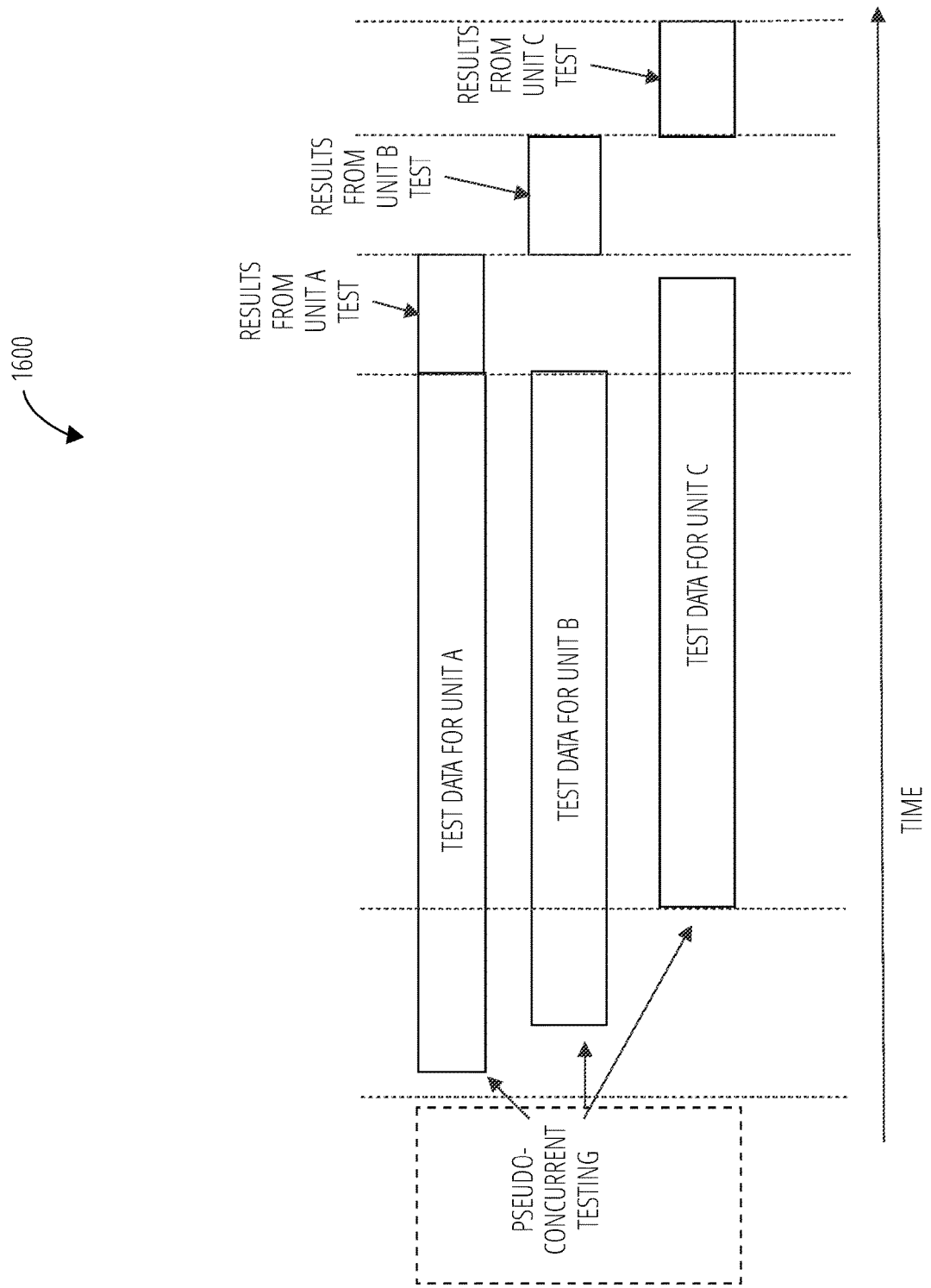
FIG. 16 illustrates data flows 1600 in accordance with one embodiment.

FIG. 16 illustrates data flows 1600 for pseudo-concurrent testing using xLBIST in one embodiment. XLBIST tests utilize small sets of test data. After forwarding the test data to each logic block controller 506 of particular design units, the tests are initiated while the top controller 302 fetches and initializes the logic block controller 506 for one or more other design units.

Figure 17:
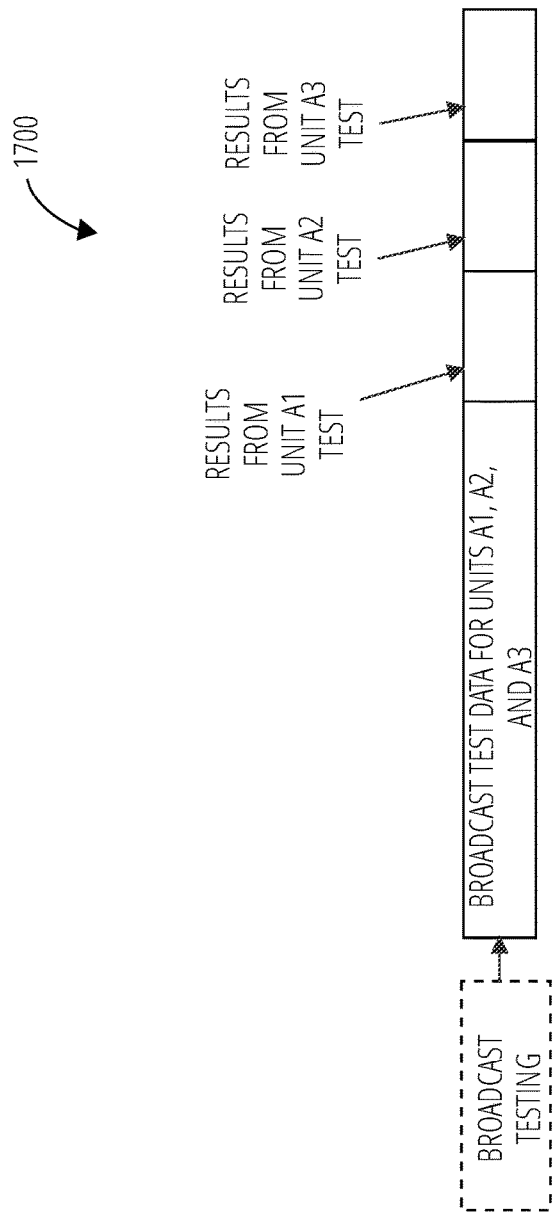
FIG. 17 illustrates data flows 1700 in accordance with one embodiment.

FIG. 17 illustrates data flows 1700 for broadcast testing in one embodiment. The data flows 1700 may be utilized for ATPG/xLBIST testing of replicated design units, in which logic blocks are replicated multiple times and utilize the test data. The test results are compared to determine which logic blocks passed or failed. To reduce the test data volume, as well as to optimize the test latency, the top controller 302 and the scan links 306 forward the test data concurrently to multiple replicated logic blocks.

Figure 18:
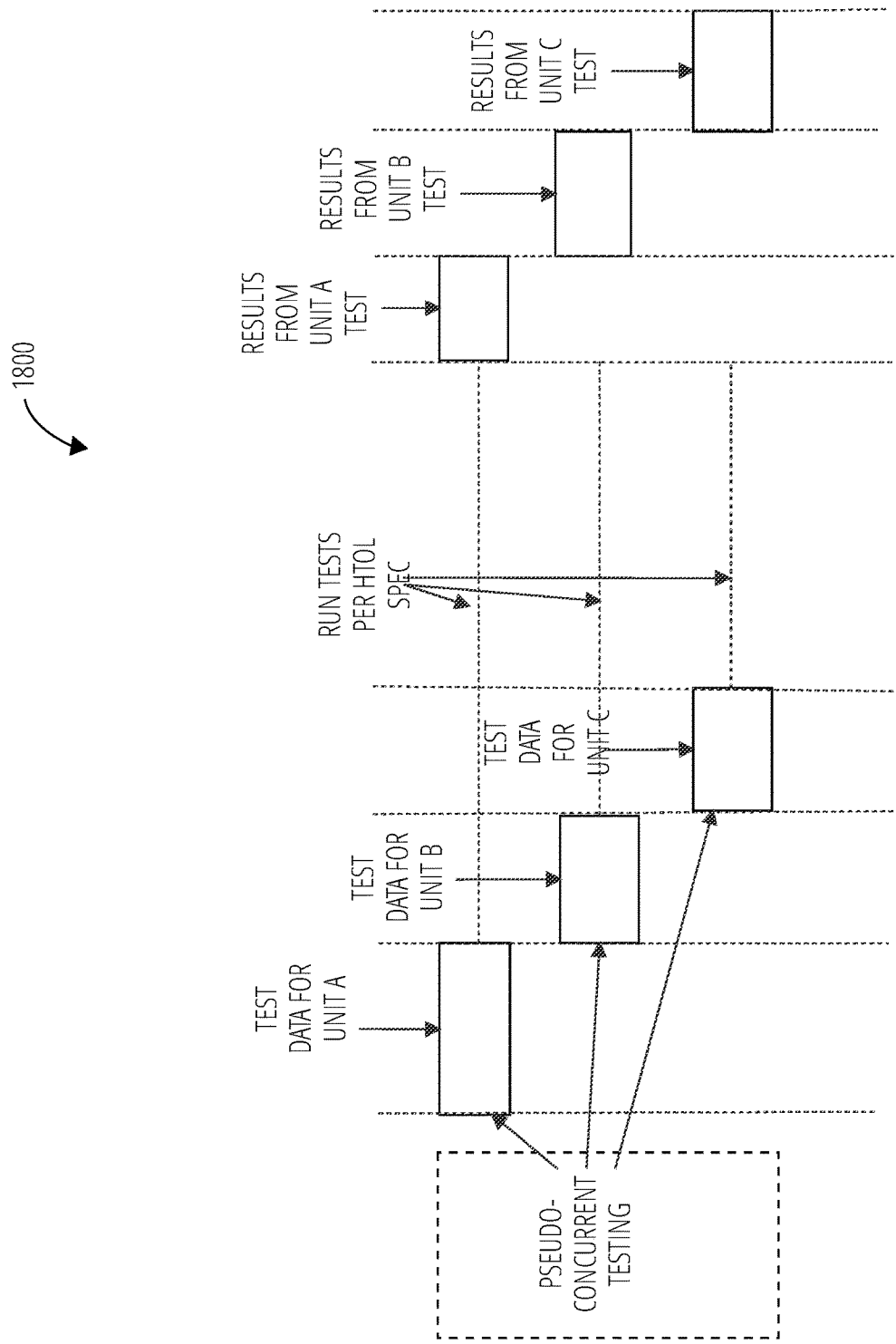
FIG. 18 illustrates data flows 1800 in accordance with one embodiment.

FIG. 18 illustrates data flows 1800 for burn-in (HTOL) tests, a form of accelerated stress test to simulate aging effects on logic blocks. The data flows 1800 depicts the use of xLBIST in pseudo-concurrent mode for all design blocks to meet HTOL requirements.

Figure 19:
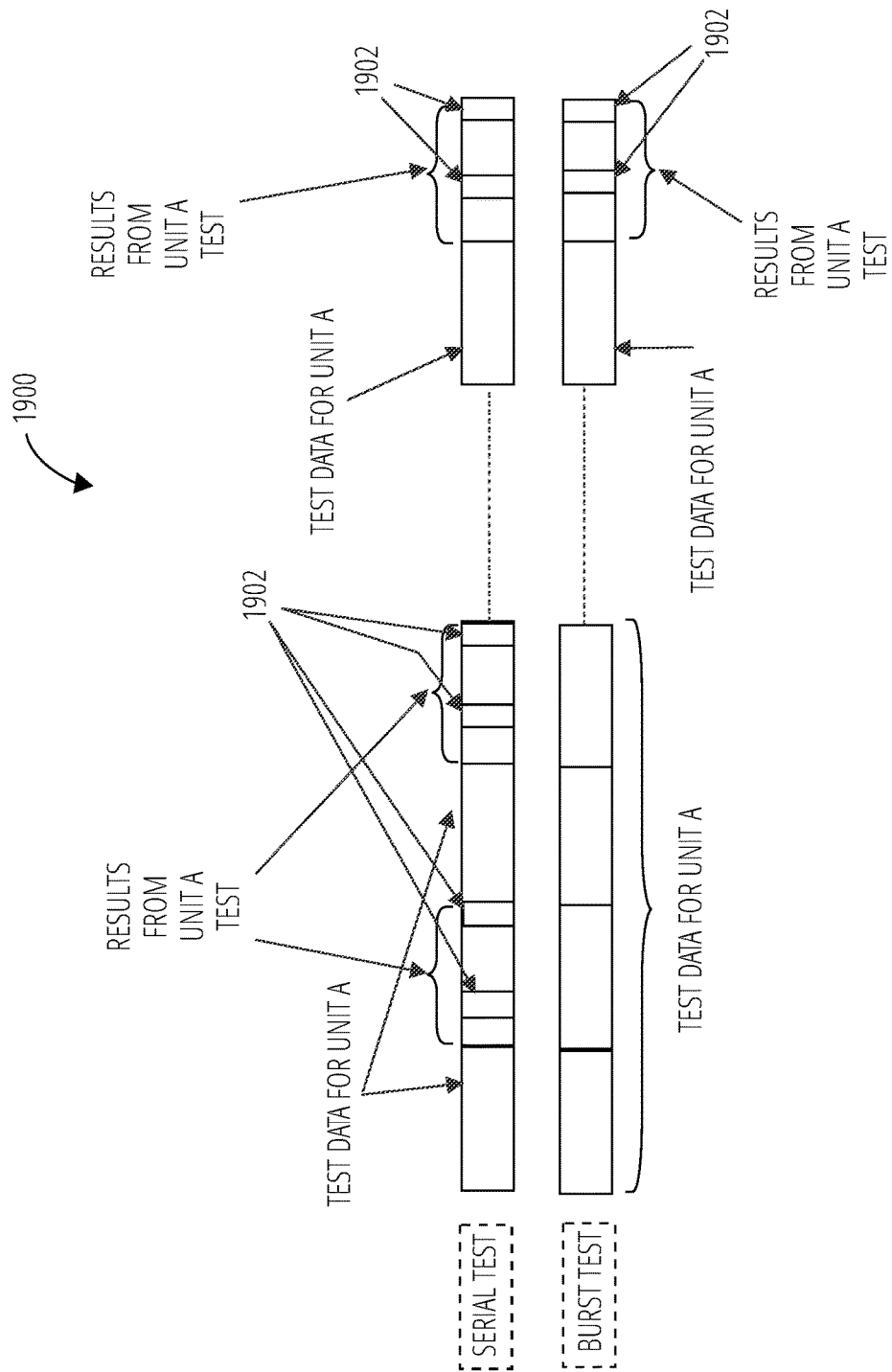
FIG. 19 illustrates data flows 1900 in accordance with one embodiment.
Figure 20:
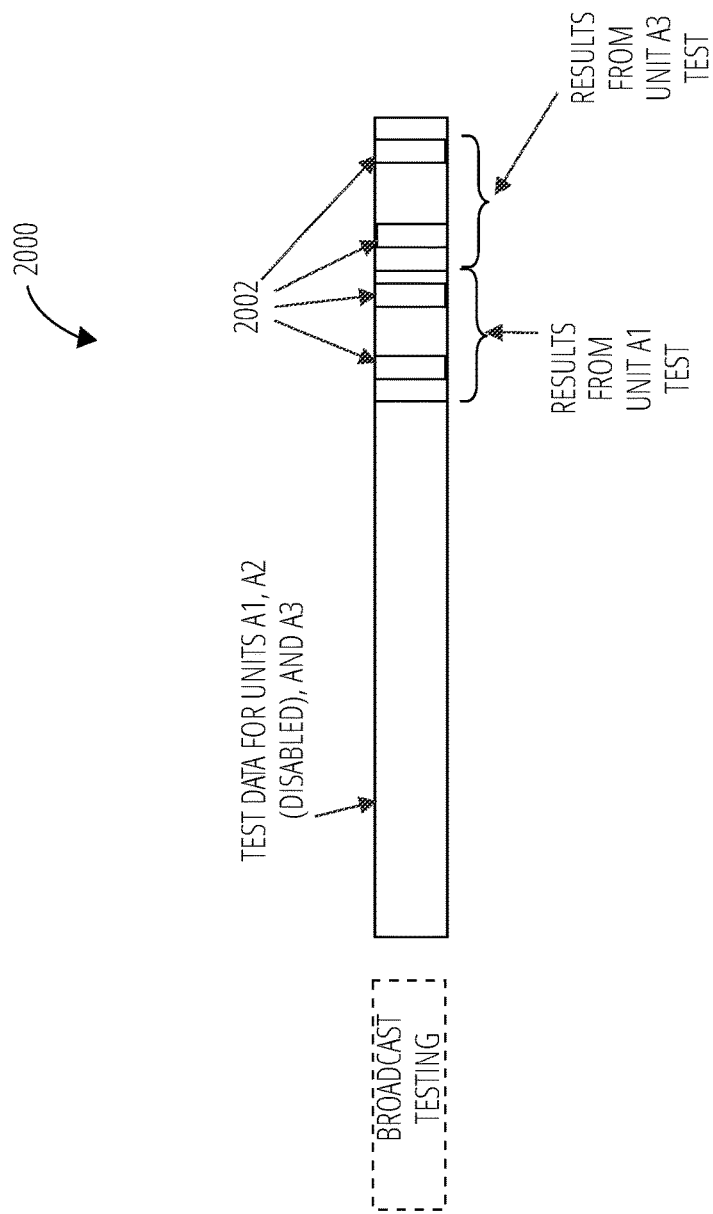
FIG. 20 illustrates data flows 2000 in accordance with one embodiment.

FIG. 19 and FIG. 20 illustrate data flows 1900 and data flows 2000 respectively for test results from non-functional or disabled logic blocks. The results from disabled logic blocks 1902 and results from disabled logic blocks 2002 may be ignored when analyzing the test results, or omitted from the returned test results. For example in an autonomous automotive application, some logic blocks may be disabled to reduce the power requirements of the system. In such cases, the test data for these regions may be applied, but not executed by the corresponding logic block controller 506. Test results corresponding to these disabled functional regions may be ignored without creating test data to meet various permutation and combinations of functional/non-functional logic blocks for different platform configurations.

Figure 21:
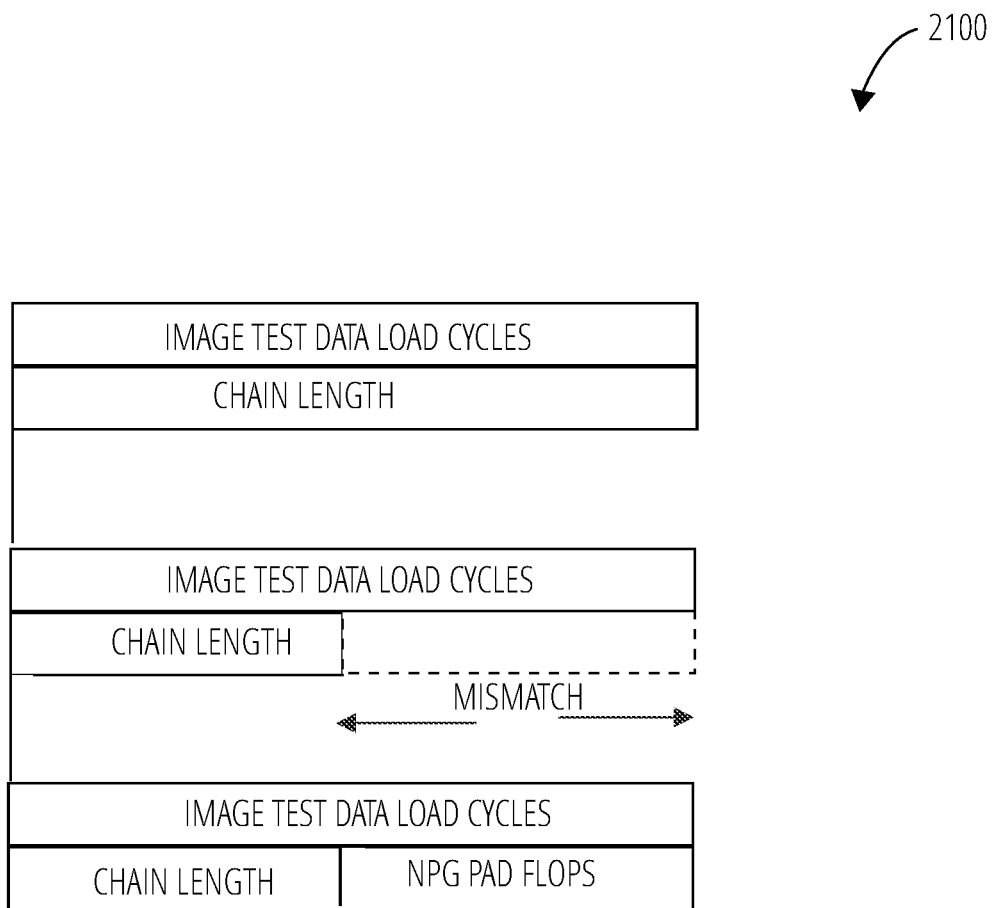
FIG. 21 illustrates a test data load cycle comparison 2100 in accordance with one embodiment.

Referring to the example test data load cycle comparison 2100 in FIG. 21, the test paths are daisy chained across functional and non-functional circuit regions and would be blocked in power clamped or rail gated regions, causing the in-system test to fail even in the functional regions. In regions that can be made non-functional in any field circuit design, the test logic is split into power gated (i.e., power clamped) and non-power-gated (NPG) circuits. The bulk of the test logic that is involved in testing (the deserializer 502, sequential decompressor 510, MISR 516, golden shadow MISR 604, etc.) is made power gated as there is no need to test a region that is permanently power-gated. However, the MISR registers (MISR 516, golden shadow MISR 604, status register 406) which are daisy chained with other regions need a non-power gated bypass path in order to not break the shift of MISR chains in functional regions. In some phases of the in-system test, each golden shadow MISR 604 also needs to be loaded with a reference ("golden") signature for the test results.

The overall length of the test result chain in any segment with bypass enabled must match the test data load cycles in the image or else the test will fail. To generate a single image suitable for testing multiple field designs, padding registers are added on the non-power gated bypass path to match the MISR length. Dummy flops in the power-gated regions are loaded with test data instead of loading the test data in the MISR of those power gated regions. As shown in the test data load cycle comparison 2100, when no padding is done, the test load cycles in the pattern data and chain length mismatch.

Figure 22:
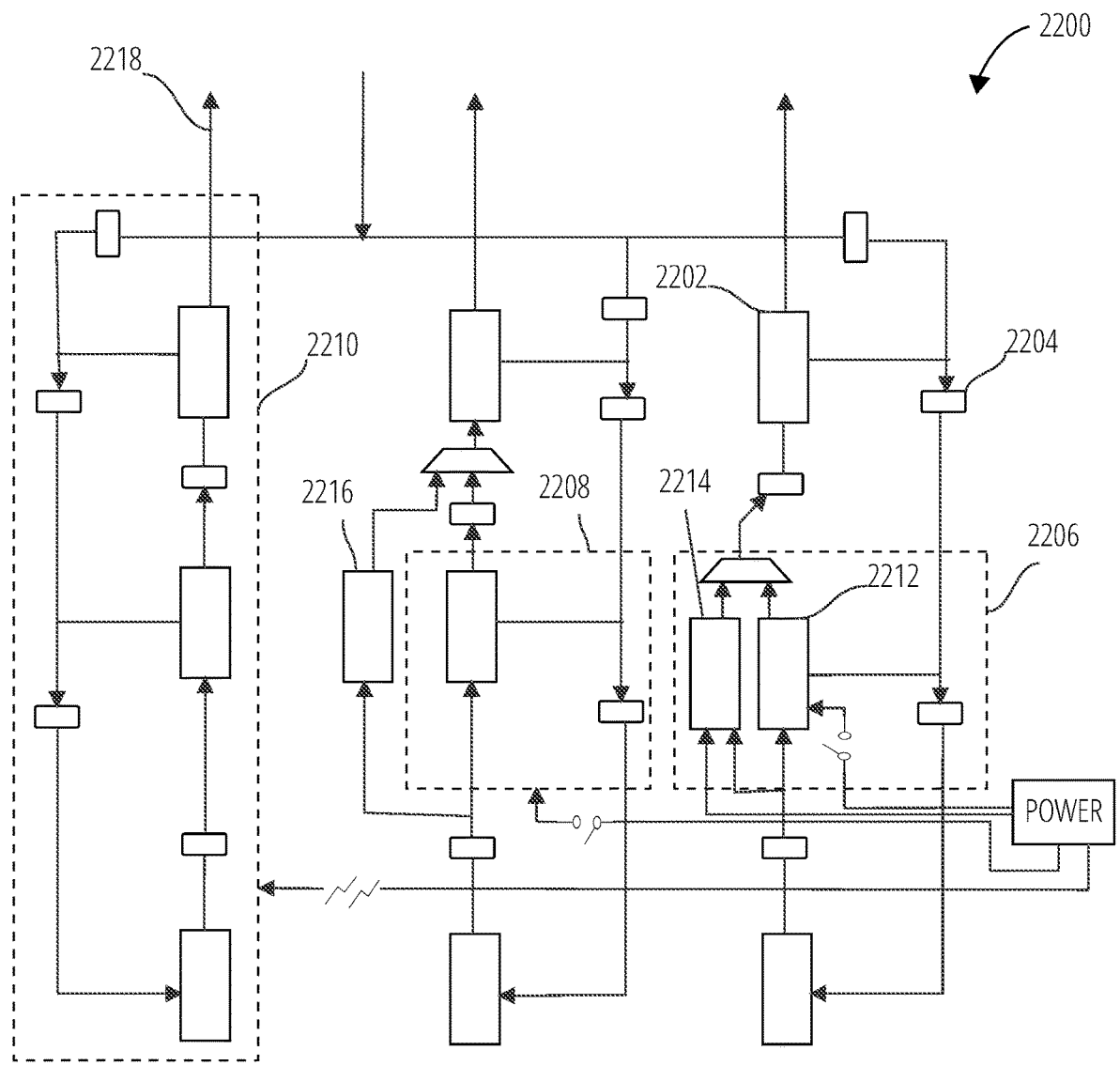
FIG. 22 illustrates a design functional test architecture 2200 in accordance with one embodiment.

FIG. 22 illustrates a design functional test architecture 2200 in one embodiment. The design functional test architecture 2200 includes multiple test partitions. Each test partition includes test logic 2202 and a status register 2204. The test partition 2206 has power clamped test logic 2212 and utilizes test logic bypass 2214 within the test partition 2206. The test partition 2208 is a fully power clamped partition. The region 2210 is rail gated, meaning it is not manufactured with a connection to the chip's power rail.

Because the test partition 2208 is power clamped a test logic bypass 2214 cannot be utilized in this region. Instead, a test logic bypass 2216 is utilized outside of the test partition 2208. Because the entire region 2210 is rail gated, it can be laid out in a separate segment with a dedicated test interface pin 2218 and the response from this test interface pin 2218 is ignored during in-system test. The test data and control signals through the power-clamped regions are distributed without power clamps and are not routed through power clamped or rail gated regions to good regions.

To enable a single test pattern set that can work across many different circuit configurations functional states of the power clamp enable signals. The functional state machines that generate the power clamp enables are JTAG-scannable and would be corrupted during in-system test.

Power clamp controls have JTAG overrides. The disclosed embodiments employ a combination of JTAG override and JTAG snoop mechanisms to set the correct power clamp states for in-system test.

There are three main types of power clamp enables: func_clamp_en, sleep_en and dft_clamp_en. Func_clamp_en controls the enable of the power clamps on functional paths crossing power-domains. During image generation func_clamp_en is asserted for all circuit regions that can be made non-functional for any of the field circuit designs that the in-system test image will be used on. This is done using JTAG overrides. This will ensure the data path interactions are consistent for all field designs.

Sleep_en controls the enable of sleep mode power switches (e.g., FETs). To maintain the electrical integrity of the chip and operate within the platform power budget, sleep enables are set to their functional states using JTAG snoop. During the setup phase of the in-system test a JTAG capture operation is performed on the JTAG value register to capture the functional state and the JTAG mask register is set.

This ensures that sleep enables retain the functional value even if the state machine generating sleep_en is scanned and corrupted. Dft_clamp_en controls the enables of power clamps on the design-for-test circuit paths (test logic). These are maintained in their functional state using JTAG snoop similar to what is done for sleep_en.

Figure 23:
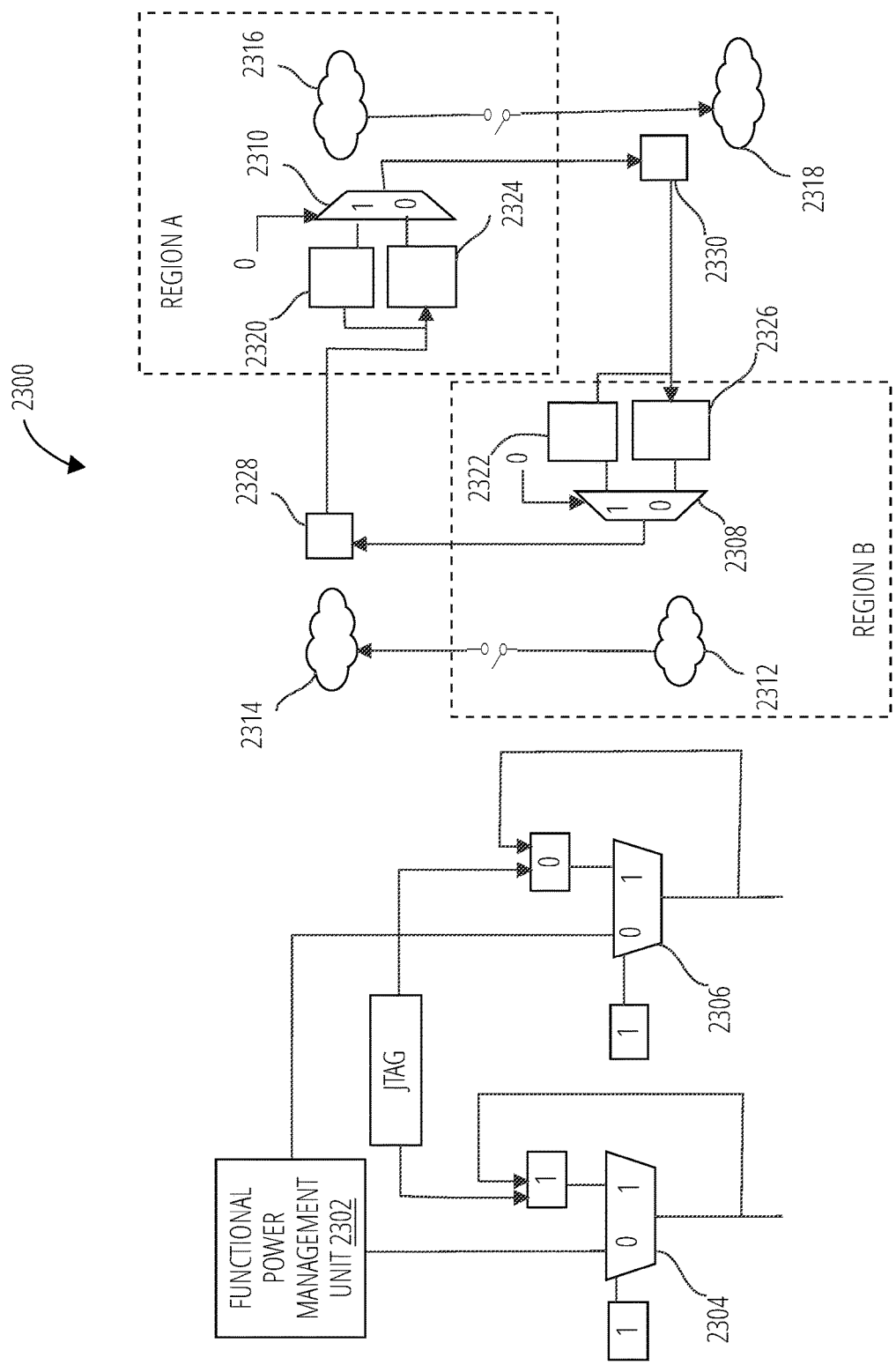
FIG. 23 illustrates a test image generation phase 2300 in accordance with one embodiment.

FIG. 23 illustrates a test image generation phase 2300 in one embodiment. The power-gated logic (e.g., MISRs) in non-functional regions are used during generation of the in-system test image; the non-power-gated bypass paths are not utilized during the in-system test image generation.

Four circuit partitions to test are illustrated, two of which (A and B) have power clamps on the functional paths to adjacent partitions. Region A includes a logic block 2316 that outputs to a logic block 2318 in an adjacent partition, the logic block 2318 having associated test logic 2330. The functional path between logic block 2316 and logic block 2318 may be power gated in some circuit field designs. Region B includes a logic block 2312 that outputs to a logic block 2314 in an adjacent partition, the logic block 2314 having associated test logic 2328. The functional path between logic block 2312 and logic block 2314 may likewise be power gated in some field circuit designs.

Region A comprises a function test result select 2310 that selects between the outputs of test logic 2324 and a non-power-gated function test bypass 2320. Region B likewise includes function test result select 2308 that selects between the outputs of test logic 2326 and a non-power-gated function test bypass 2322.

The functional power management unit 2302 outputs are applied along with JTAG shift register values to a function test enable select 2304 and a function select 2306. The JTAG values are always selected for application to the circuit for which the image is being generated; the functional settings are not used.

During the test image generation phase 2300 the power clamps of all regions that can be made nonfunctional in any field implementation of the chip are enabled using JTAG override. This will ensure the data path interaction remains consistent for any in-system test regardless of the particular implementation of power clamping in the field. The sleep_en controls are used to enable sleep FETs to maintain the electrical integrity of the chip and operate within the platform power budget. Sleep enables are maintained in their functional states using JTAG snoop.

Figure 24:
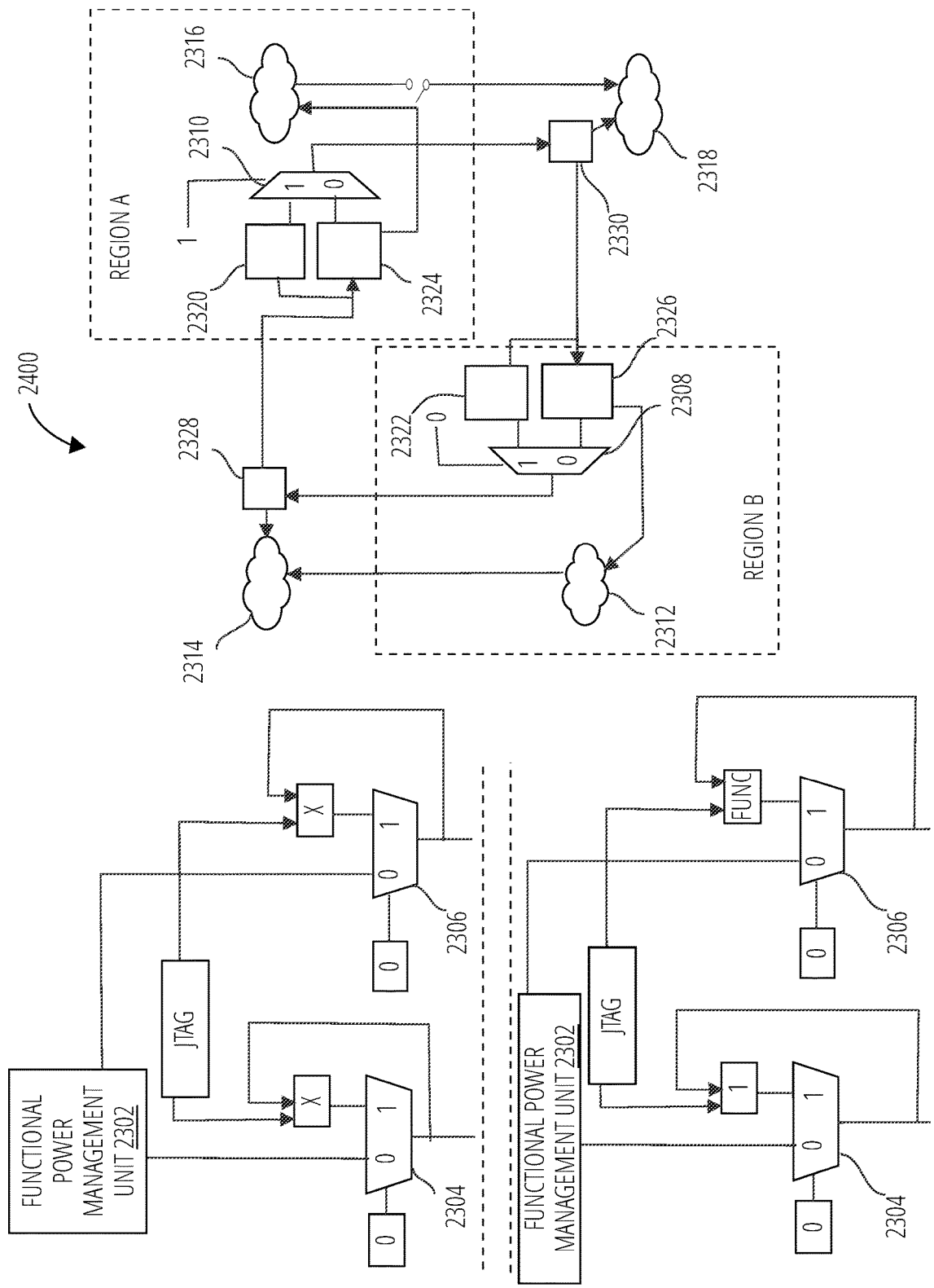
FIG. 24 illustrates a pre-in-system test phase and a first in-system test phase 2400 in accordance with one embodiment.
Figure 25:
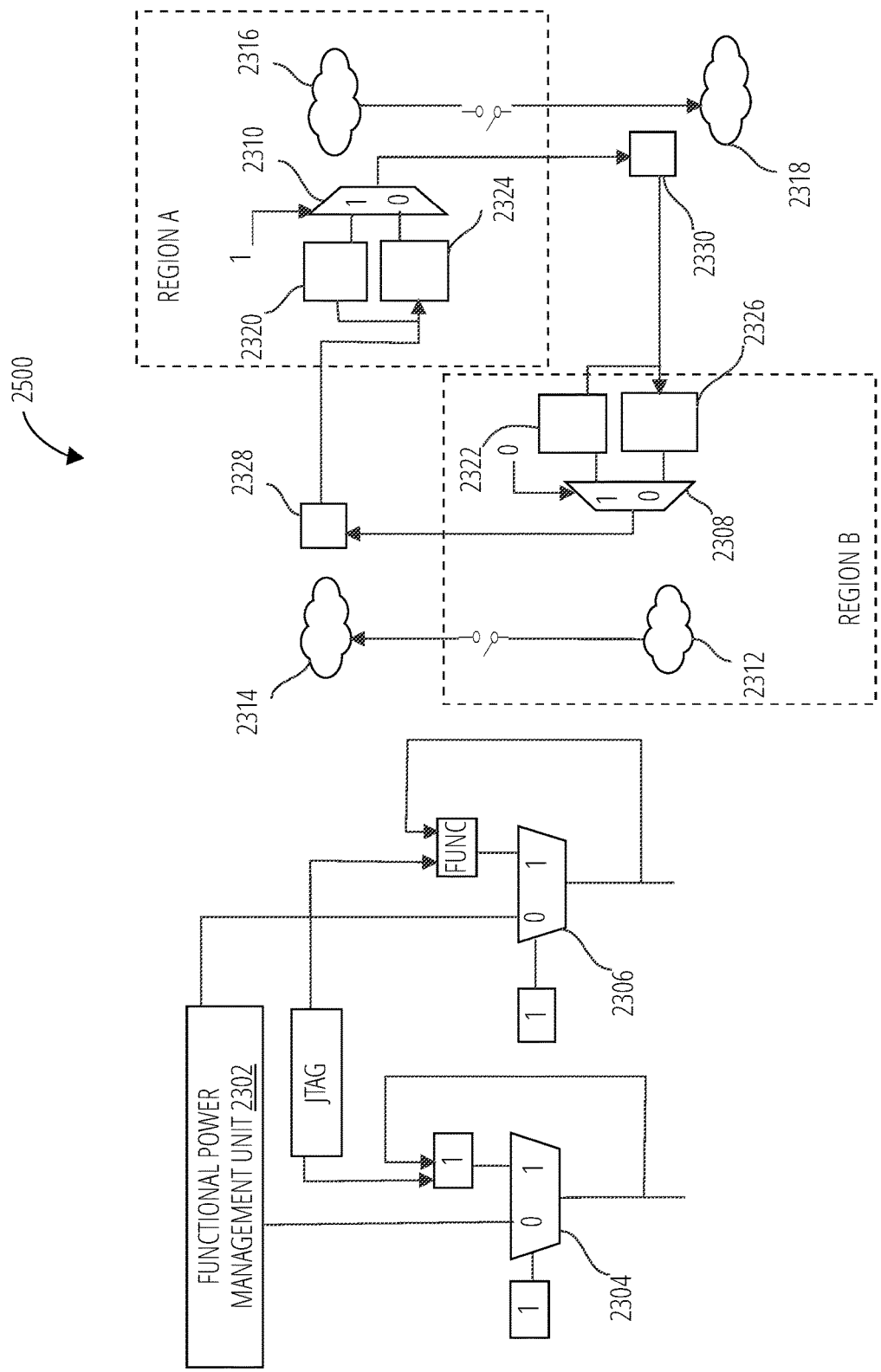
FIG. 25 illustrates a second in-system test phase 2500 in accordance with one embodiment.

Referring now to the pre-in-system test phase and a first in-system test phase 2400 of FIG. 24, and the second in-system test phase 2500 of FIG. 25, the func_clamp_en state is switched from ON to OFF for Region B during the first in-system test setup sequence. The func_clamp_en state is then switched from OFF to ON for Region B during the second in-system test setup sequence, even though it is not power-gated, to match the func_clamp_en state for Region B in the in-system test image.

The function test enable select 2304 of region A is switched OFF for generation of the in-system test image, but is switched ON for the second sequence of the in-system test setup sequence, and padding registers in the non-power-gated function test bypass 2322 are shifted out, instead of shifting values out of the test logic 2326 (e.g., real MISR 516). The padding registers of the non-power-gated function test bypass 2322 in region A do not contain any real test response data and the test result analytic software ignores those values.

If, in a different design, region A was functional instead of non-functional, the generated in-system test image could still be used for in-system test, except that during the in-system test, the real MISR test result values in test logic 2326 are shifted out and analyzed for region A, instead of the values in the padding registers of the non-power-gated function test bypass 2322 of region A.

In some designs a power gated partition with non-functional units may still include some non-power-gated logic that is functional, for example, re-time stages going through the power gated partition. This non-power-gated logic can cause in-system test to fail in, for example, adjacent functional regions. If the functional design cannot be altered to move this non-power-gated logic out, dedicated power clamps may be added on the functional paths that interact with functional logic outside the power gated partition. These dedicated power clamps will always be enabled for in-system test image generation. Test coverage of the functional non-power gated logic is lost but this is a compromise made to enable running the in-system test on many field variations of the chip using a single test image.

Figure 26:
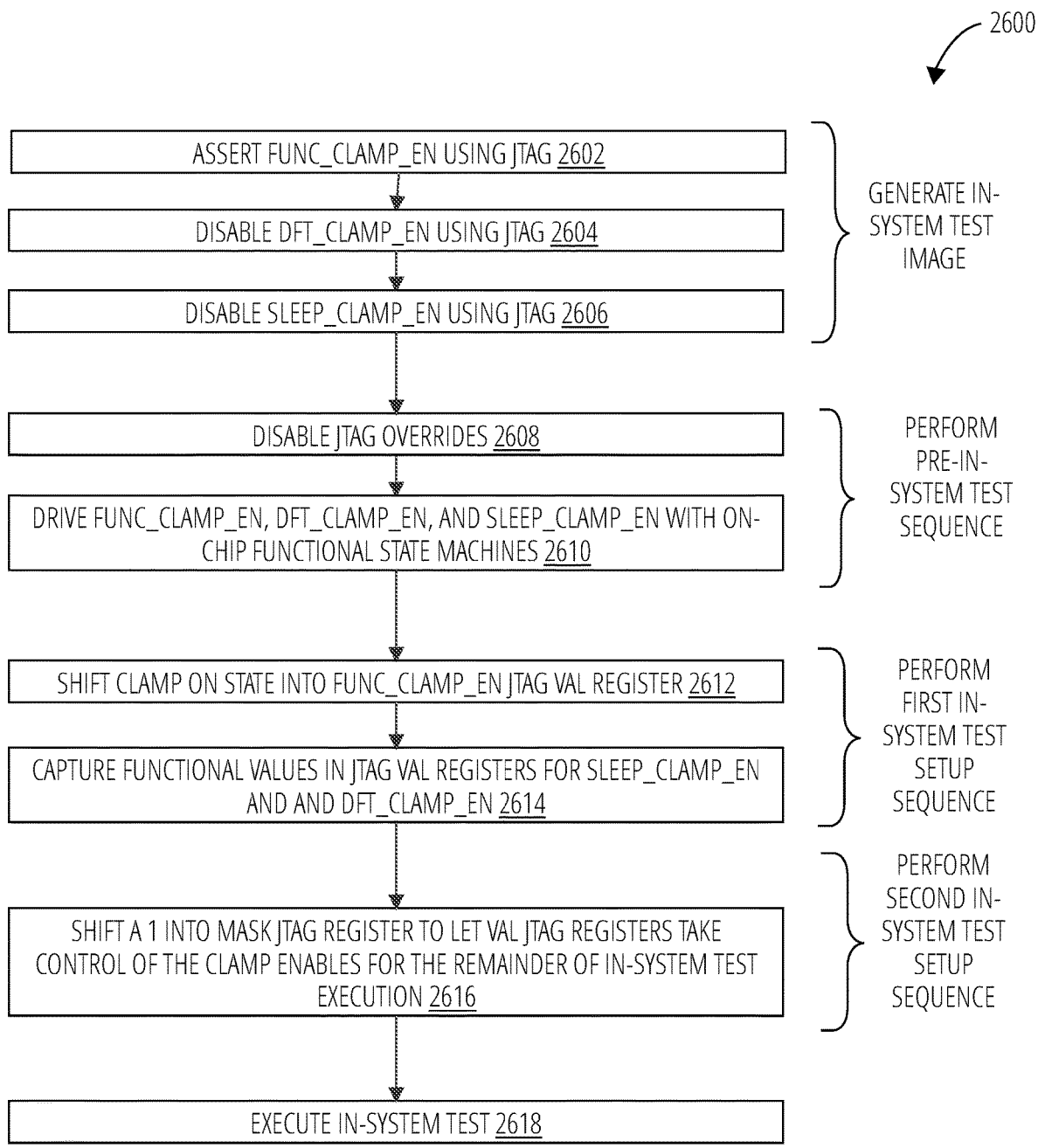
FIG. 26 illustrates an in-system test process 2600 in accordance with one embodiment.

FIG. 26 illustrates an in-system test process 2600 in one embodiment. The in-system test process 2600 begins with generation of the in-system test image; the functional power clamps (functional clamps) are asserted (block 2602), the test logic power clamps (design-for-test clamps) are de-asserted (block 2604), and the sleep clamps are de-asserted (block 2606). Collectively, the state controls for these clamps are called clamp enables.

Next for the pre-in-system test phase, the JTAG overrides are disabled (block 2608), and the on-chip functional state machines drive the functional power clamp states, the sleep clamp states, and the test logic power clamp states (block 2610).

The first pre-in-system test sequence is then performed, which involves shifting the state of the func_clamp_en (state control for functional clamps) into the JTAG VAL register (block 2612), and then capturing the functional values for sleep_clamp_en (state control for sleep clamps) and dft_clamp_en (state control for sleep clamps) from the JTAG registers (block 2614).

For the second pre-in-system test sequence, a "1" is shifted into the JTAG MASK register (block 2616) to enable the JTAG VAL register value to control the values of the functional, sleep, and test logic power clamps during in-system test (block 2618).

A modified MBIST architecture enables grouping of memory array circuits such that memory arrays in different functional regions are tested by independent MBIST controllers. A rail-gated or power gated MBIST test component will not stall another MBIST controller in an ungated region. Responses from non-functional regions can be masked by asserting a corresponding FUSE register. The FUSE register settings may be altered depending on which regions are non-functional in a particular circuit design. Thus a single in-system test MBIST test image that is generated assuming all regions of a reference circuit design are functional may be applied across all versions of the circuit regardless of the gating utilized in a particular implementation.

Figure 27:
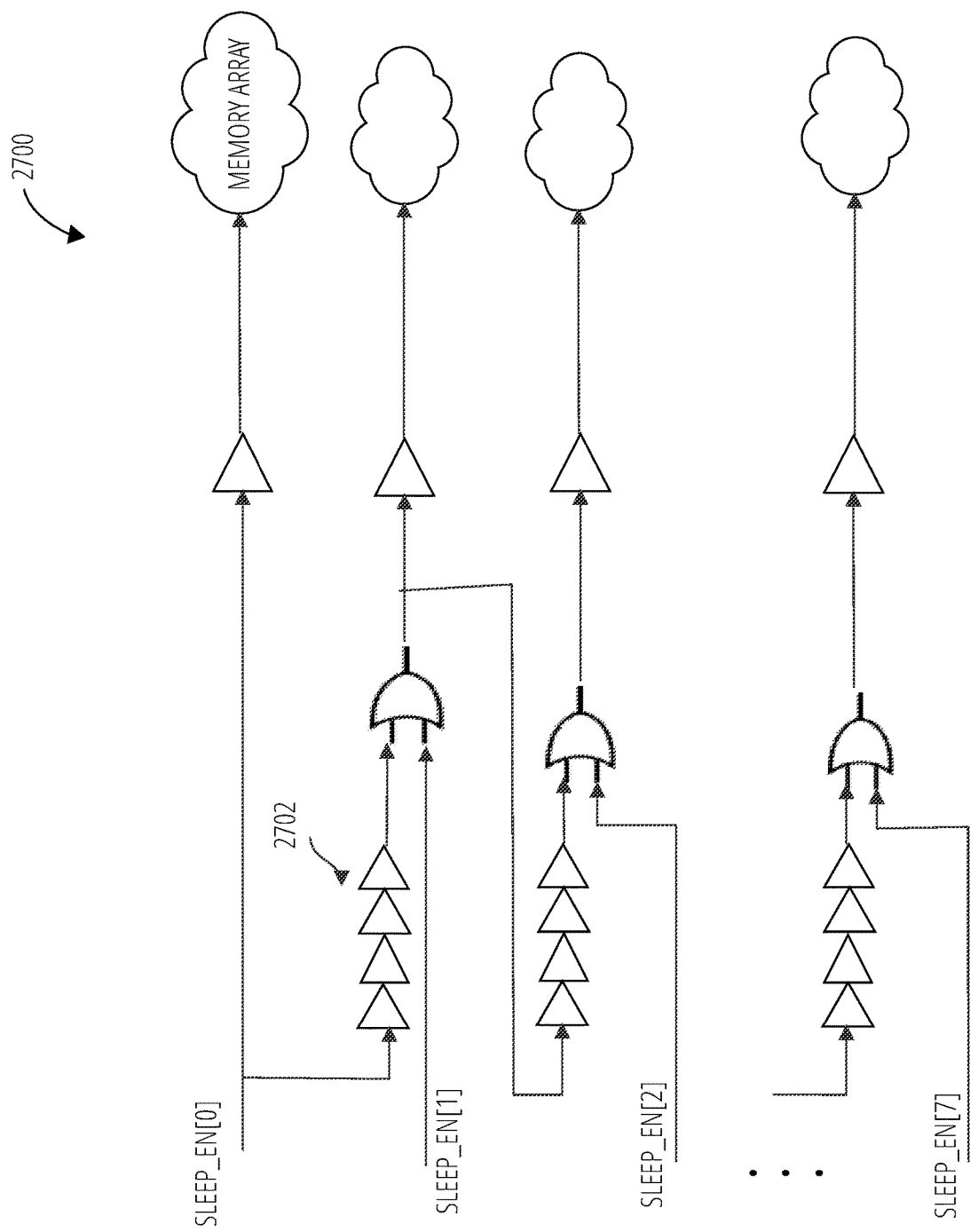
FIG. 27 illustrates a combination delay circuit 2700 in accordance with one embodiment.

FIG. 27 illustrates a combination delay circuit 2700 in one embodiment. To account for late-addition design changes the in-system test controller wakes up the non-functional power-gated regions using JTAG. JTAG power wake-up sequences tend to be slow in comparison to the performance requirements for in-system test. The combination delay circuit 2700 may help remediate this timing mismatch.

If a region of a circuit is non-functional and power-gated, the sleep enable controls for the circuit are fused (permanently configured) to the asserted state. To wake up the non-functional regions for in-system test, the sleep enable controls of the non-functional regions need to be de-asserted. This can result in an in-rush current (I_inrush) surge while waking up the regions. To address this problem the sleep network may be split into eight regions per power domain. Each region's sleep_en signal is associated with a JTAG override. De-assertion of sleep_en across regions is staggered to mitigate the in-rush current. Merely shifting the JTAG registers several times to change one bit every shift requires several JTAG cycles, and because the JTAG clock is typically a slow clock relative to the circuit clock, this can substantially increase the wake up sequence time.

To improve the time to wake the non-functional regions while maintaining I_inrush within the functional limits, the combination delay circuit 2700 is added to the circuit, subsequent to the JTAG overrides on the sleep-enable control network. The combination delay circuit 2700 is inserted on the sleep_en bus before it drives the sleep power gates or SRAM sleep_en inputs for the memory regions to test. The combination delay circuit 2700 comprises a number of delay buffers 2702 inserted on each sleep_en bitline. The delayed sleep_en bit is OR'd with the next sequential sleep_en bit, thus introducing a delay chain as the sleep sequence progresses from sleep_en[0] to sleep_en[7].

Utilizing the combination delay circuit 2700 staggers the sleep_en[7:0] bus de-assertion with an inter-bit delay to maintain the in-rush current within the functional limits.

Figure 28:
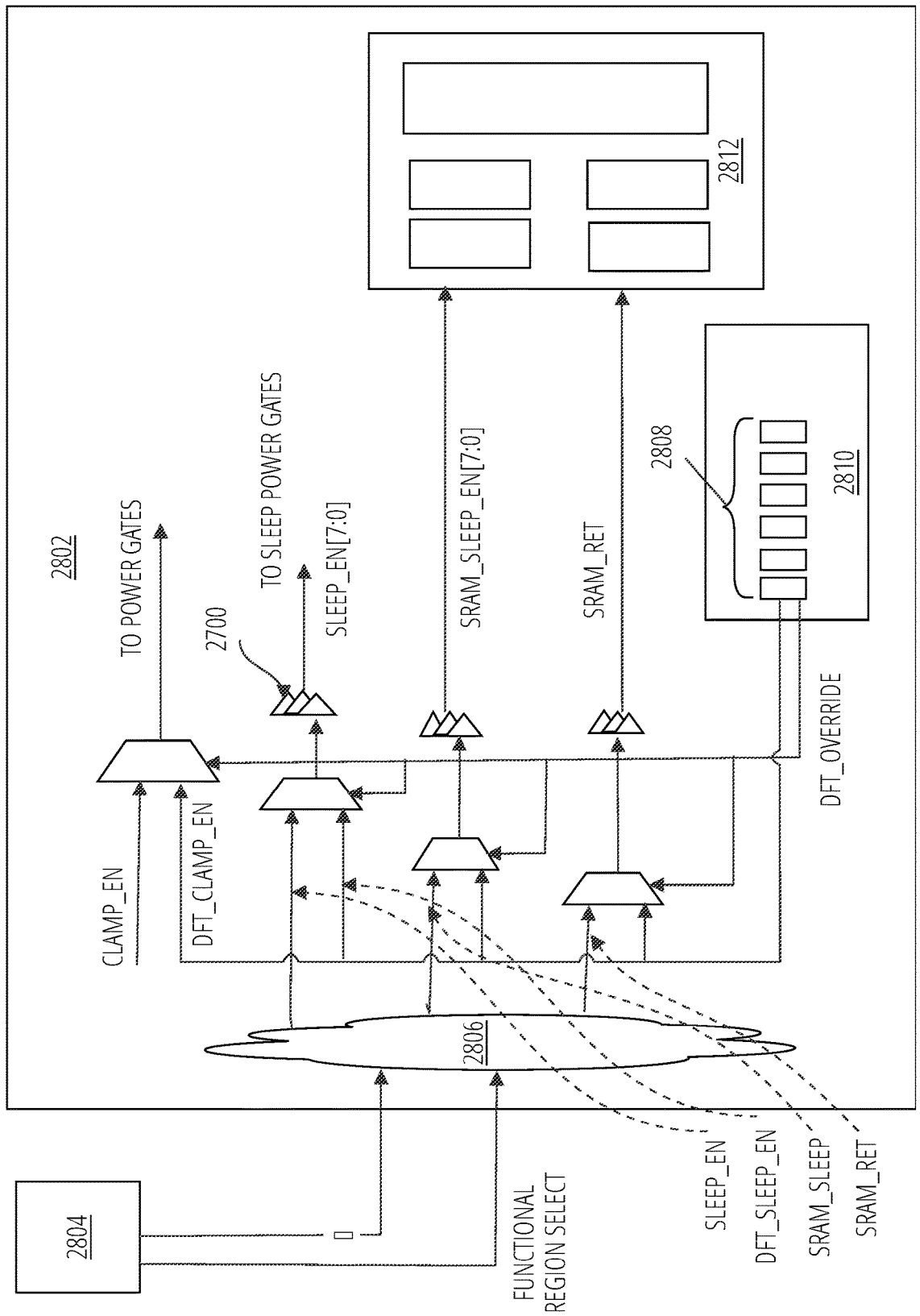
FIG. 28 illustrates a test partition 2802 in accordance with one embodiment.

FIG. 28 illustrates a test partition 2802 in one embodiment. As illustrated in the test partition 2802 embodiment of FIG. 28, the sleep_en JTAG shift register 2808 overrides in the IEEE 1500 component 2810 may be shifted just once so that the sleep power gates experience the sleep_en signals toggling in a staggered fashion. The inter-bit delay to apply with the combination delay circuit 2700 for a particular implementation may be estimated using SPICE simulations. The power management controller 2804 and bus decoder 2806 select a region of the test partition 2802 for test, and the required signals are asserted to operate the power and sleep gates of the selected region (e.g., memory arrays 2812).

Terms used herein should be accorded their ordinary meaning in the relevant arts, or the meaning indicated by their use in context, but if an express definition is provided, that meaning controls.

"Logic" herein refers to machine memory circuits, non-transitory machine-readable media, and/or circuitry that by way of its material and/or material-energy configuration comprises control and/or procedural signals, and/or settings and values (such as resistance, impedance, capacitance, inductance, current/voltage ratings, etc.), that may be applied to influence the operation of a device. Electronic circuits such as controllers, field programmable gate arrays, processors, and memory (both volatile and nonvolatile) comprising processor-executable instructions are examples of logic. Logic specifically excludes pure signals or software per se (however does not exclude machine memories comprising software and thereby forming configurations of matter).

Various logic functional operations described herein may be implemented in logic that is referred to using a noun or noun phrase reflecting said operation or function. For example, an association operation may be carried out by an "associator" or "correlator". Likewise, switching may be carried out by a "switch", selection by a "selector", and so on.

Those skilled in the art will appreciate that logic may be distributed throughout one or more devices or components, and/or may be comprised of combinations memory, media, processing circuits and controllers, other circuits, and so on. Therefore, in the interest of clarity and correctness logic may not always be distinctly illustrated in drawings of devices and systems, although it is inherently present therein. The techniques and procedures described herein may be implemented via logic distributed in one or more computing devices. The particular distribution and choice of logic will vary according to implementation.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, claims in this application that do not otherwise include the "means for" [performing a function] construct should not be interpreted under 35 U.S.C § 112(f).

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

What is claimed is:

1. A method of generating an in-system test image for a circuit, the method comprising:
    disabling JTAG overrides for the circuit;
    operating functional state machines of the circuit to drive clamp enables of the circuit, the clamp enables comprising functional clamps, sleep clamps, and design-for-test clamps;
    shifting a state control for the functional clamps into one or more registers; and
    capturing functional enable values of the sleep clamps and the design-for-test clamps in the one or more registers.

2. The method of claim 1, wherein shifting the state control for the functional clamps comprises shifting a first value into at least one JTAG VAL register.

3. The method of claim 2, further comprising:
    shifting a second value into at least one MASK JTAG register to enable the at least one JTAG VAL register to take control of the clamp enables.

4. The method of claim 1, wherein the sleep clamps are maintained in functional states via JTAG snoop.

5. The method of claim 1, wherein the design-for-test clamps are maintained in functional states via JTAG snoop.

6. The method of claim 1, wherein the sleep clamps are disabled in a staggered sequence.

7. The method of claim 6, wherein the staggered sequence is implemented using a delay circuit chain.

8. The method of claim 1, wherein the circuit comprises a plurality of operational configurations (SKUs) each comprising a set of functional regions and non-functional regions, and wherein the functional clamps are disabled for an aggregate set of all non-functional regions of all the SKUs and responses from the non-functional regions are masked.

9. The method of claim 1, further comprising:
enabling the clamp enables on non-power-gated regions of non-functional regions on paths that interact with functional regions.

10. A system comprising:
a memory; and
a processor responsive to instructions from the memory to:
disable JTAG overrides for a circuit;
drive clamp enables of the circuit, the clamp enables comprising functional clamps, sleep clamps, and design-for-test clamps;
shift a state control for the functional clamps into one or more first JTAG register; and
read functional enable values of the sleep clamps and the design-for-test clamps from at least one second JTAG register.

11. The system of claim 10, wherein shifting the state control for the functional clamps comprises shifting a first value into at least one JTAG VAL register.

12. The system of claim 11, the instructions in the memory further configuring the processor to:
shift a second value into at least one MASK JTAG register to enable the at least one JTAG VAL register to take control of the clamp enables.

13. The system of claim 10, wherein the instructions configure the processor to maintain the sleep clamps in functional states via JTAG snoop.

14. The system of claim 10, wherein the instructions configure the processor to maintain the design-for-test clamps in functional states via JTAG snoop.

15. The system of claim 10, wherein the wherein the sleep clamps are disabled in a staggered sequence.

16. The system of claim 15, further comprising a delay circuit chain to provide the staggered sequence.

17. The system of claim 10, wherein the circuit comprises a plurality of operational configurations (SKUs) each comprising a set of functional regions and non-functional regions, and wherein the wherein the instructions configure the processor to disable the functional clamps for an aggregate set of all non-functional regions of all the SKUs and to mask responses from the non-functional regions.

18. The system of claim 10, wherein the instructions configure the processor to:
enable the clamp enables on non-power-gated regions of non-functional regions on paths that interact with functional regions.

* * * * *